(12) United States Patent
Kong et al.

(10) Patent No.: US 12,046,586 B2
(45) Date of Patent: Jul. 23, 2024

(54) LIGHT-EMITTING DEVICE, MANUFACTURING METHOD THEREOF, AND DISPLAY DEVICE HAVING SAME

(71) Applicant: SAMSUNG DISPLAY CO., LTD., Yongin-si (KR)

(72) Inventors: Tae Jin Kong, Yongin-si (KR); Dae Hyun Kim, Yongin-si (KR); Myeong Hee Kim, Yongin-si (KR); Veidhes Basrur, Yongin-si (KR); Je Won Yoo, Yongin-si (KR); Xinxing Li, Yongin-si (KR); Hee Keun Lee, Yongin-si (KR); Bek Hyun Lim, Yongin-si (KR); Hyun Min Cho, Yongin-si (KR); Chang Il Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 605 days.

(21) Appl. No.: 17/269,737

(22) PCT Filed: Feb. 20, 2019

(86) PCT No.: PCT/KR2019/002066
§ 371 (c)(1),
(2) Date: Feb. 19, 2021

(87) PCT Pub. No.: WO2020/040384
PCT Pub. Date: Feb. 27, 2020

(65) Prior Publication Data
US 2021/0202451 A1  Jul. 1, 2021

(30) Foreign Application Priority Data
Aug. 20, 2018  (KR) .......... 10-2018-0096837

(51) Int. Cl.
*H01L 25/075* (2006.01)
*B82B 3/00* (2006.01)
(Continued)

(52) U.S. Cl.
CPC ........ *H01L 25/0753* (2013.01); *B82B 3/0052* (2013.01); *H01L 27/1214* (2013.01);
(Continued)

(58) Field of Classification Search
CPC ............. H01L 25/0753; H01L 27/1214; H01L 33/0062; H01L 33/24; H01L 33/36;
(Continued)

(56) References Cited

U.S. PATENT DOCUMENTS 9,329,433 B2  5/2016  Negishi et al.
10,340,419 B2  7/2019  Kim et al.
(Continued)

FOREIGN PATENT DOCUMENTS

CN  107611153  1/2018
CN  112437988  3/2021
(Continued)

OTHER PUBLICATIONS

International Search Report, with English translation, corresponding to International Application No. PCT/KR2019/002066 dated Jun. 5, 2019.
(Continued)

*Primary Examiner* — Bilkis Jahan
*Assistant Examiner* — Victor V Barzykin
(74) *Attorney, Agent, or Firm* — KILE PARK REED & HOUTTEMAN PLLC

(57) ABSTRACT

A light emitting device includes first and second electrodes disposed on a substrate; an insulating layer disposed on the substrate and including a groove extending in a first direction intersecting with the first and the second electrodes, and
(Continued)

first and second contact portions that expose areas of the first and the second electrodes; light emitting elements disposed in the groove between the first and the second electrodes, each including first and second ends electrically connected to the first and second electrodes, respectively; a first contact electrode electrically connected to the light emitting elements on the first ends, and electrically connected to the first electrode on the first contact portion; and a second contact electrode electrically connected to the light emitting elements on the second ends, and electrically connected to the second electrode on the second contact portion.

19 Claims, 16 Drawing Sheets

(51) Int. Cl.
  *H01L 27/12* (2006.01)
  *H01L 33/00* (2010.01)
  *H01L 33/24* (2010.01)
  *H01L 33/36* (2010.01)
  *H01L 33/44* (2010.01)
  *H01L 33/62* (2010.01)
  *G09G 3/32* (2016.01)

(52) U.S. Cl.
  CPC .......... *H01L 33/0062* (2013.01); *H01L 33/24* (2013.01); *H01L 33/36* (2013.01); *H01L 33/44* (2013.01); *H01L 33/62* (2013.01); *G09G 3/32* (2013.01); *G09G 2300/0842* (2013.01); *H01L 2933/0016* (2013.01); *H01L 2933/0025* (2013.01)

(58) Field of Classification Search
  CPC . H01L 33/44; H01L 33/62; H01L 2933/0016; H01L 2933/0025; H01L 33/0095; H01L 33/20; H01L 2933/0066; H01L 27/156; B82B 3/0052; G09G 3/32; G09G 2300/0842
  See application file for complete search history.

(56) References Cited

U.S. PATENT DOCUMENTS

| | | | |
|---|---|---|---|
| 10,461,123 B2 | 10/2019 | Kim et al. | |
| 10,672,946 B2 | 6/2020 | Cho et al. | |
| 2008/0251381 A1 | 10/2008 | Shibata et al. | |
| 2010/0065863 A1* | 3/2010 | Ray | H01L 25/0753 257/E31.127 |
| 2018/0026074 A1* | 1/2018 | Lee | H01L 33/38 362/219 |
| 2019/0305035 A1* | 10/2019 | Cho | H01L 33/46 |
| 2019/0319168 A1 | 10/2019 | Kim | |
| 2019/0326348 A1 | 10/2019 | Im et al. | |
| 2021/0288217 A1 | 9/2021 | Li et al. | |

FOREIGN PATENT DOCUMENTS

| | | |
|---|---|---|
| EP | 1 603 170 | 12/2005 |
| EP | 3 316 301 | 5/2018 |
| JP | 2012-4535 | 1/2012 |
| JP | 5422628 | 2/2014 |
| JP | 2015-126048 | 7/2015 |
| KR | 10-2015-0048979 | 5/2015 |
| KR | 10-2018-0007376 | 1/2018 |
| KR | 10-2018-0009014 | 1/2018 |
| KR | 10-2018-0072909 | 7/2018 |
| KR | 10-2018-0079079 | 7/2018 |
| KR | 10-1874396 | 7/2018 |
| KR | 10-2019-0120467 | 10/2019 |
| KR | 10-2019-0121894 | 10/2019 |
| KR | 10-2019-0124359 | 11/2019 |
| KR | 10-2020-0006208 | 1/2020 |
| KR | 10-2020-0006651 | 1/2020 |

OTHER PUBLICATIONS

Written Opinion, with English translation, corresponding to International Application No. PCT/KR2019/002066, dated Jun. 5, 2019.
Korean Notice of Allowance for Korean Patent Application No. 10-2023-0092667, dated May 22, 2024.

* cited by examiner

LIGHT-EMITTING DEVICE, MANUFACTURING METHOD THEREOF, AND DISPLAY DEVICE HAVING SAME

CROSS REFERENCE TO RELATED APPLICATION(S)

This application is a national entry of International Application No. PCT/KR2019/002066, filed on Feb. 20, 2019, which claims under 35 U.S.C. § 119(a) and 365(b) priority to and benefits of Korean Patent Application No. 10-2018-0096837, filed on Aug. 20, 2018 in the Korean Intellectual Property Office, the entire contents of which are hereby incorporated by reference.

BACKGROUND

1. Technical Field

Various embodiments of the disclosure relate to a light emitting device, a method of fabricating the light emitting device, and a display device having the light emitting device.

2. Background Art

Recently, techniques have been developed for manufacturing a subminiature light emitting element using a material having a reliable inorganic crystal structure, and for manufacturing a light emitting device using the light emitting element. For example, a light emitting device has been developed in which subminiature light emitting elements each having a microscale or nanoscale size are disposed in each light emitting area to form a light source. Such a light emitting device may be used as a light source in various electronic devices such as a display device and/or a lighting device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments of the disclosure are directed to a light emitting device that may include multiple light emitting elements, a method of fabricating the light emitting device, and a display device including the light emitting device.

According to an aspect of the disclosure, a light emitting device may include a first electrode and a second electrode disposed on a substrate and spaced apart from each other, and an insulating layer disposed on the substrate on which the first electrode and the second electrode may be formed. The insulating layer may include a groove extending in a first direction intersecting with the first electrode and the second electrode, and a first contact portion and a second contact portion that respectively expose areas of the first electrode and the second electrode. The light emitting device may include light emitting elements disposed in the groove and located between the first and the second electrodes, each of the light emitting elements comprising a first end and a second end electrically connected to the first electrode and the second electrode, respectively, a first contact electrode electrically connected to the light emitting elements on the first ends, and electrically connected to the first electrode on the first contact portion, and a second contact electrode electrically connected to the light emitting elements on the second ends, and electrically connected to the second electrode on the second contact portion.

In an embodiment, each of the light emitting elements may include a rod-type light emitting diode having a length extending in the first direction.

In an embodiment, the groove may have a width greater than a diameter or width of each of the light emitting elements.

In an embodiment, each of the light emitting elements may have a size in a range of a nanoscale to a microscale.

In an embodiment, the first electrode and the second electrode may be disposed parallel to each other in at least an area on the substrate, and each of the first electrode and the second electrode may extend in a second direction intersecting with the first direction.

In an embodiment, the insulating layer may include at least one organic insulating layer including a polymer.

In an embodiment, the insulating layer may further include at least one inorganic insulating layer disposed between the substrate and the organic insulating layer.

In an embodiment, the light emitting device may include a plurality of grooves disposed in a second direction intersecting with the first direction.

In an embodiment, the light emitting device may further include a first partition wall disposed between the substrate and the first electrode, and a second partition wall disposed between the substrate and the second electrode.

In an embodiment, the light emitting device may further include a first insulating pattern disposed on areas of the light emitting elements and located between the first contact electrode and the second contact electrode.

In an embodiment, the light emitting device may further include a second insulating pattern that covers upper portions of the first insulating pattern and the first contact electrode.

In an embodiment, an end of the second contact electrode may be disposed on an end of the second insulating pattern that may be adjacent to the second ends of the light emitting elements.

According to an aspect of the disclosure, a method of fabricating a light emitting device may include forming, on a substrate, a first partition wall and a second partition wall spaced apart from each other, forming a first electrode and a second electrode on the first partition wall and the second partition wall, respectively, forming at least one insulating layer on the substrate on which the first electrode and the second electrode may be formed, forming, in a surface of the insulating layer, at least one groove intersecting with the first electrode and the second electrode, supplying light emitting elements onto the at least one insulating layer including in the at least one groove, aligning the light emitting elements by forming an electric field between the first electrode and the second electrode, forming a first contact portion and a second contact portion by etching the at least one insulating layer so that areas of the first electrode and the second electrode may be exposed, forming a first contact electrode on an area of the substrate including first ends of the light emitting elements and the first contact portion, and forming a second contact electrode on an area of the substrate including second ends of the light emitting elements and the second contact portion.

In an embodiment, the forming of the at least one insulating layer may include forming an inorganic insulating layer on the substrate on which the first electrode and the second electrode may be formed, and forming an organic insulating layer on the inorganic insulating layer.

In an embodiment, the forming of the at least one groove may include disposing a rubbing device on the organic insulating layer to contact the organic insulating layer, and moving at least one of the substrate and the rubbing device in a direction intersecting the first electrode and the second electrode, and pressing the organic insulating layer.

In an embodiment, the forming of the at least one groove may include disposing a rubbing device on the organic insulating layer, and forming a plurality of grooves in a surface of the organic insulating layer by pressing the organic insulating layer at intervals of a distance.

In an embodiment, the forming of the first contact portion and the second contact portion may include forming a first insulating pattern on areas of the light emitting elements such that the first ends and the second ends of the light emitting elements may be exposed, etching the organic insulating layer over areas of the first electrode and the second electrode, and etching the inorganic insulating layer such that the areas of the first electrode and the second electrode may be exposed.

In an embodiment, the forming of the first contact electrode and the second contact electrode may include forming the first contact electrode on the areas of the light emitting elements and the first contact portion such that the first contact electrode is in contact with the first ends of the light emitting elements and the area of the first electrode, forming a second insulating pattern on the first contact electrode, and forming the second contact electrode on the areas of the light emitting elements and the second contact portion such that the second contact electrode is in contact with the second ends of the light emitting elements and the area of the second electrode.

In an embodiment, the aligning of the light emitting elements may include applying, onto the substrate by an inkjet printing scheme or a slit coating scheme, a solution in which the plurality of light emitting elements may be dispersed.

According to an aspect of the disclosure, a display device may include a substrate including a display area, and a pixel disposed in the display area. The pixel may include a first electrode and a second electrode disposed on the substrate and spaced apart from each other, an insulating layer disposed on the substrate on which the first electrode and the second electrode may be formed. The insulating layer may include a groove extending in a first direction intersecting with the first electrode and the second electrode, and a first contact portion and a second contact portion that respectively expose areas of the first electrode and the second electrode, light emitting elements disposed in the groove between the first electrode and the second electrode, each of the light emitting elements comprising a first end and a second end electrically connected to the first electrode and the second electrode, respectively, a first contact electrode electrically connected to the light emitting elements on the first ends, and electrically connected to the first electrode on the first contact portion, and a second contact electrode electrically connected to the light emitting elements on the second ends, and electrically connected to the second electrode on the second contact portion.

In a light emitting device, a method of fabricating the light emitting device, and a display device including the light emitting device in accordance with embodiments of the disclosure, a plurality of light emitting elements may be efficiently and uniformly aligned between first and second electrodes. Consequently, emission characteristics of the light emitting device and the display device including the light emitting device can be enhanced.

DETAILED DESCRIPTION OF THE EMBODIMENTS

Figure 1A:
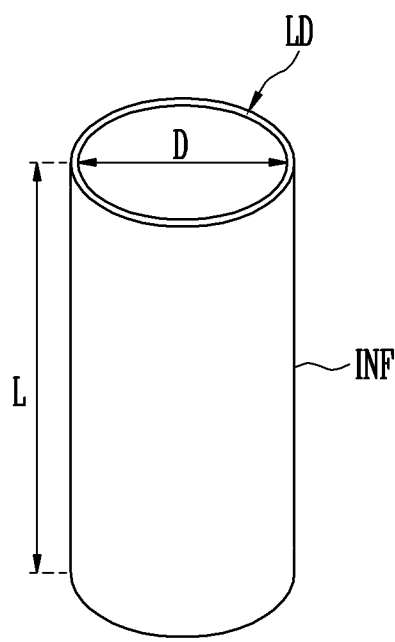
FIGS. 1A and 1B are respectively a schematic perspective diagram and a schematic sectional diagram illustrating a light emitting element in accordance with an embodiment of the disclosure.

Reference will now be made in detail to various embodiments of the disclosure, specific examples of which are illustrated in the accompanying drawings and described below. Embodiments and details of the disclosure are described with reference to the accompanying drawings in order to describe the disclosure in detail so that those having ordinary knowledge in the technical field to which the disclosure pertains can easily practice the disclosure. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

It will be understood that, although the terms "first", "second", etc. may be used herein to describe various elements, these elements should not be limited by these terms. It will be further understood that the terms "comprise", "include", "have", etc. when used herein, specify the presence of stated features, integers, steps, operations, elements, components, and/or combinations thereof, but do not preclude the presence or addition of one or more other features, integers, steps, operations, elements, components, and/or combinations thereof. Furthermore, when a first part such as a layer, a film, a region, or a plate is disposed "on", etc., a second part, the first part may be not only directly on the second part but a third part may intervene between them. Furthermore, concepts relating to "position", "direction", etc. used in the following description are relative concepts, and it should be noted that terms relating thereto may be reversed, etc., depending on a view angle or direction.

A singular form may include a plural form. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

The expression "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as generally understood by those skilled in the art. Terms as defined in a commonly used dictionary should be construed as having the same meaning as in an associated technical context, and unless apparent in the description, the terms should not be ideally or excessively construed as having formal meaning.

FIGS. 1A, 1B, 2A, 2B, 3A, and 3B are schematic perspective diagrams and schematic sectional diagrams illustrating light emitting elements LD in accordance with embodiments of the disclosure. Although FIGS. 1A to 3B illustrate cylindrical rod-type light emitting elements LD, the kind and/or shape of the light emitting elements LD in accordance with the disclosure is not limited thereto.

Figure 1B:
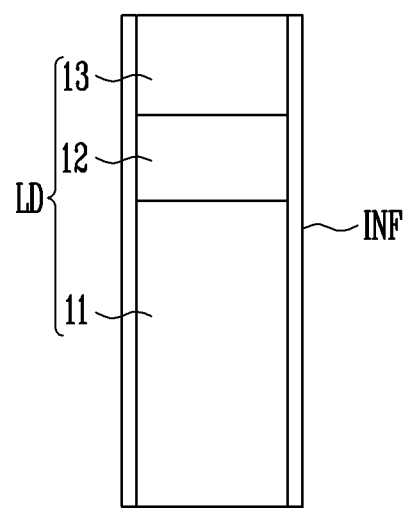

Referring to FIGS. 1A and 1B, a light emitting element LD in accordance with an embodiment of the disclosure may include a first conductive semiconductor layer 11, a second conductive semiconductor layer 13, and an active layer 12 interposed between the first and second conductive semiconductor layers 11 and 13. For example, the light emitting element LD may be configured of a stacked body formed by successively stacking the first conductive semiconductor layer 11, the active layer 12, and the second conductive semiconductor layer 13 on each other.

In an embodiment, the light emitting element LD may be provided in the form of a rod extending in a direction. If the direction in which the light emitting element LD extends is defined as a longitudinal direction (L), the light emitting element LD may have a first end and a second end with respect to the longitudinal direction (L).

In an embodiment, one of the first and second conductive semiconductor layers 11 and 13 may be disposed on the first end of the light emitting element LD, and another of the first and second conductive semiconductor layers 11 and 13 may be disposed on the second end of the light emitting element LD.

In an embodiment, the light emitting element LD may be fabricated in the form of a rod. In this disclosure, the term "rod-type" embraces a rod-like shape and a bar-like shape such as a cylindrical shape and a prismatic shape extending in a longitudinal direction (e.g., to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size corresponding to a nanoscale size to a microscale size, e.g., a diameter D and/or a length L corresponding to a microscale to nanoscale range. However, in the disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductive semiconductor layer 11 may include, for example, at least one n-type semiconductor layer. For instance, the first conductive semiconductor layer 11 may include an n-type semiconductor layer which includes any one or more semiconductor material of InAlGaN, GaN, AlGaN, InGaN, AlN, and InN, and may be doped with a first conductive dopant such as Si, Ge, Sn, or a combination thereof. However, the material forming the first conductive semiconductor layer 11 is not limited thereto, and the first conductive semiconductor layer 11 may be formed of various other materials.

The active layer 12 may be disposed on the first conductive semiconductor layer 11 and have a single or multiple quantum well structure. In an embodiment, a cladding layer (not shown) doped with a conductive dopant may be formed on and/or under the active layer 12. For example, the cladding layer may be formed of an AlGaN layer, an InAlGaN layer, or a combination thereof. In an embodiment, a material such as AlGaN or AlInGaN may be used to form the active layer 12, and various other materials may be used to form the active layer 12.

If an electric field having a voltage or more is applied to the opposite ends of the light emitting element LD, the light emitting element LD may emit light by combination of electron-hole pairs in the active layer 12. Since light emission of the light emitting element LD can be controlled based on the foregoing principle, the light emitting element LD may be used as a light source of various light emitting devices as well as a pixel of the display device.

The second conductive semiconductor layer 13 may be disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes any one or more semiconductor material of InAlGaN, GaN, AlGaN, InGaN, AlN, and InN, and may be doped with a second conductive dopant such as Mg. However, the material forming the second conductive semiconductor layer 13 is not limited thereto, and the second conductive semiconductor layer 13 may be formed of various other materials.

In an embodiment, an insulating film INF may be provided on an outer circumferential surface of the light emitting element LD (e.g., an outer side surface of a cylinder). For instance, the insulating film INF may be formed on the surface of the light emitting element LD to enclose an outer circumferential surface of at least the active layer 12. The insulating film INF may further enclose at least a portion of each of the first and second conductive semiconductor layers 11 and 13. Here, the insulating film INF may allow the opposite ends of the light emitting element LD that have different polarities to be exposed to the outside. For example, the insulating film INF may expose one end of each of the first and second conductive semiconductor layers 11 and 13 that may be disposed on the respective opposite ends of the light emitting element LD with respect to the longitudinal direction (L), e.g., may expose each of the top and bottom surfaces of the cylinder rather than covering it.

In an embodiment, the insulating film INF may include at least one insulating material of $SiO_2$, $Si_3N_4$, $Al_2O_3$, and $TiO_2$, but it is not limited thereto. In other words, the material forming the insulating film INF is not limited to a particular material, and the insulating film INF may be formed of well-known various insulating materials.

In an embodiment, the light emitting element LD may further include additional other components as well as the first conductive semiconductor layer 11, the active layer 12, and the second conductive semiconductor layer 13. For example, the light emitting element LD may further include at least one fluorescent layer, at least one active layer, at least one semiconductor layer and/or at least one electrode layer disposed on one end of the first conductive semiconductor layer 11, the active layer 12, and/or the second conductive semiconductor layer 13.

Figure 2A:
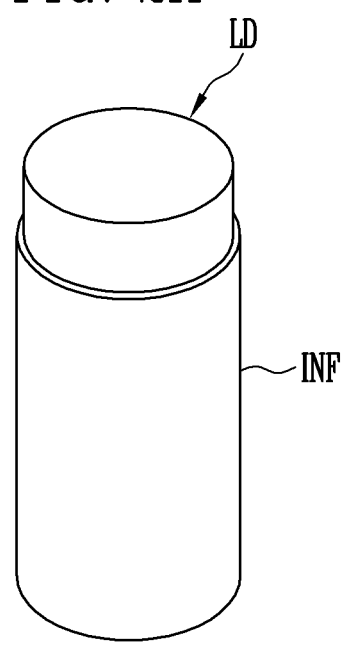
FIGS. 2A and 2B are respectively a schematic perspective diagram and a schematic sectional diagram illustrating a light emitting element in accordance with an embodiment of the disclosure.
Figure 2B:
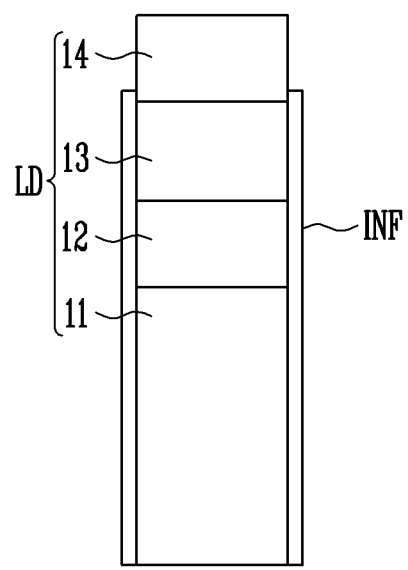
Figure 3A:
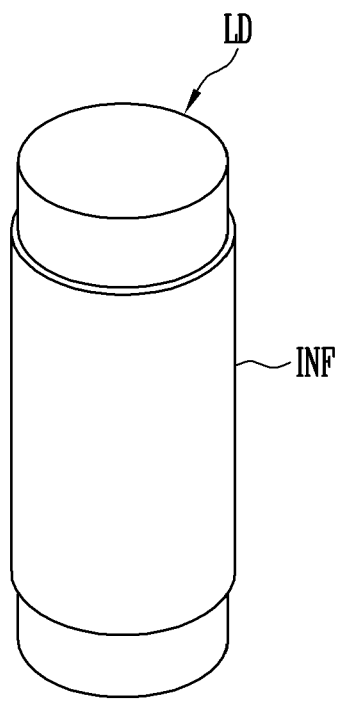
FIGS. 3A and 3B are respectively a schematic perspective diagram and a schematic sectional diagram illustrating a light emitting element in accordance with an embodiment of the disclosure.
Figure 3B:
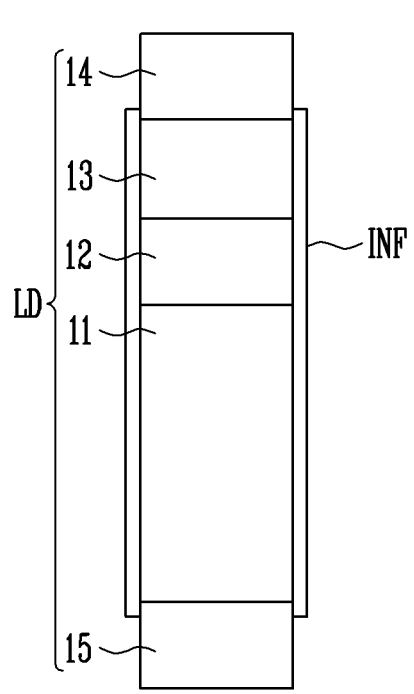

For example, as illustrated in FIGS. 2A and 2B, the light emitting element LD may further include at least one electrode layer 14 disposed on one end of the second conductive semiconductor layer 13. In an embodiment, as illustrated in FIGS. 3A and 3B, the light emitting element LD may further include at least one electrode layer 15 disposed on one end of the first conductive semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, or an oxide or alloy thereof may be used alone or in combination with each other. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. In other embodiments, in an embodiment, the insulating film INF may not be provided.

If the insulating film INF is provided on the surface of the light emitting element LD, particularly, on the surface of the active layer 12, the active layer 12 may be prevented from short-circuiting with at least one electrode which is not shown (e.g., at least one contact electrode of contact electrodes connected to the opposite ends of the light emitting element LD), etc. Consequently, the electrical stability of the light emitting element LD may be secured.

Furthermore, thanks to the insulating film INF formed on the surface of the light emitting element LD, occurrence of a defect on the surface of the light emitting element LD may be minimized, whereby the lifetime and efficiency of the light emitting element LD may be improved. In case that the insulating film INF is formed on each light emitting element LD, even in case that multiple light emitting elements LD are disposed adjacent to each other, the light emitting elements LD may be prevented from undesirably short-circuiting.

In an embodiment of the disclosure, a surface treatment process may be performed to fabricate the light emitting element LD. For example, the light emitting element LD may be surface-treated (e.g., through a coating process) so that, in case multiple light emitting elements LD are mixed with a fluidic solution and supplied to each light emitting area (e.g., a light emitting area of each pixel), the light emitting elements LD can be evenly distributed rather than unevenly aggregating in the solution.

A light emitting device including the light emitting element LD described above may be used in various devices including a display device which may require a light source. For example, multiple subminiature light emitting elements LD may be disposed in each pixel region of a light emitting display panel, thereby forming a light emitting part of each pixel. Furthermore, the field of application of the light emitting element LD according to the disclosure is not limited to a display device. For example, the light emitting element LD may also be used in various devices such as a lighting device, which may require a light source.

Figure 4:
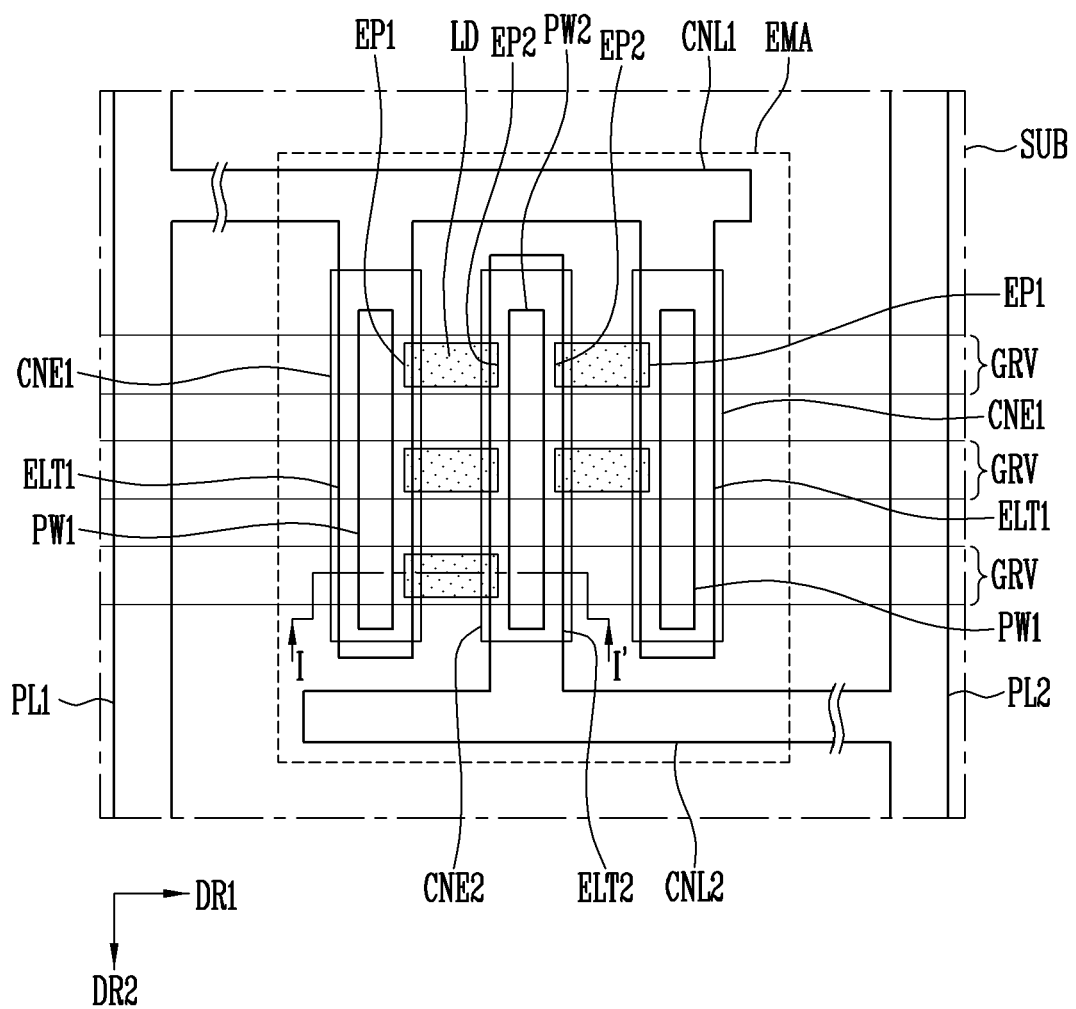
FIGS. 4 and 5 each are a schematic plan diagram illustrating a light emitting device in accordance with an embodiment of the disclosure.
Figure 5:
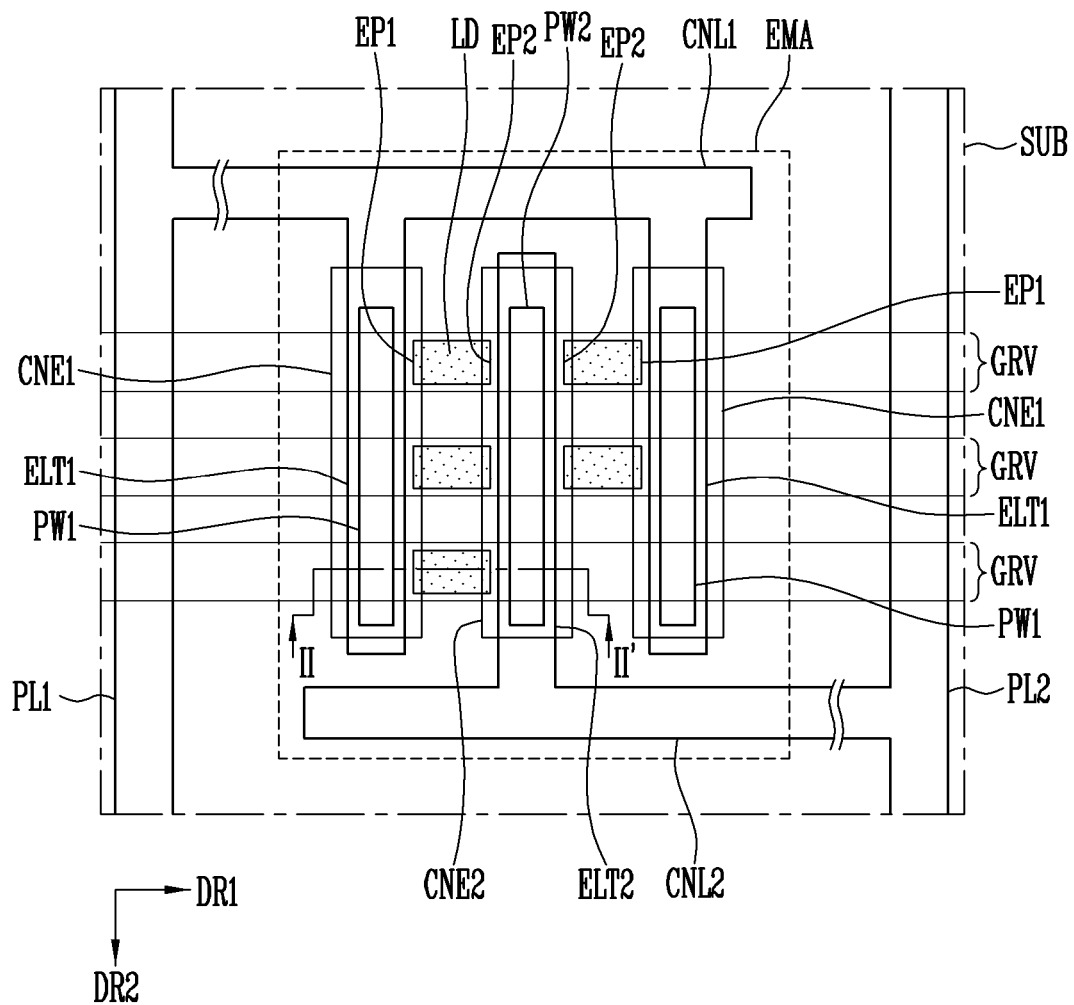

FIGS. 4 and 5 are respective schematic plan diagrams illustrating light emitting devices in accordance with embodiments of the disclosure. FIGS. 4 and 5 illustrate light emitting devices each of which may include first and second power lines PL1 and PL2 or may be electrically connected (e.g., directly connected) to the first and second power lines PL1 and PL2. However, the light emitting device according to the disclosure is not limited to the embodiments illustrated in FIGS. 4 and 5. For example, in an embodiment of the disclosure, the light emitting device may be electrically connected to the first and/or second power line PL1 and/or PL2 via at least one circuit element (e.g., a pixel circuit), an intermediate connection line, or the like.

Referring to FIGS. 4 and 5, a light emitting device in accordance with an embodiment of the disclosure may include a substrate SUB, a first partition wall PW1 and a second partition wall PW2 which may be disposed on the substrate SUB, a first electrode ELT1 and a second electrode ELT2 which may be respectively disposed on the first and second partition walls PW1 and PW2, multiple light emitting elements LD disposed between the first and second electrodes ELT1 and ELT2, and a first contact electrode CNE1 and a second contact electrode CNE2 which respectively electrically connect first and second ends EP1 and EP2 of the light emitting elements LD to the first and second electrodes ELT1 and ELT2. However, the light emitting device according to the disclosure is not limited to the embodiments illustrated in FIGS. 4 and 5. For example, in an embodiment of the disclosure, at least one light emitting area EMA included in the light emitting device may include only a single light emitting element LD.

The light emitting device may further include a first connection electrode CNL1 which connects the first electrode ELT1 to the first power line PL1, and a second connection electrode CNL2 which connects the second electrode ELT2 to the second power line PL2. In an embodiment, the first and second connection electrodes CNL1 and CNL2 may be respectively and integrally connected to the first and second electrodes ELT1 and ELT2, or electrically connected to the first and second electrodes ELT1 and ELT2 via at least one contact hole or the like. In the case where the first and second connection electrodes CNL1 and CNL2 may be respectively and integrally connected to the first and second electrodes ELT1 and ELT2, each of the first and second connection electrodes CNL1 and CNL2 may be regarded as being an area of a corresponding electrode of the first and second electrodes ELT1 and ELT2.

The substrate SUB may form a base component of the light emitting device and be a rigid substrate or a flexible substrate. For example, the substrate SUB may be a rigid substrate made of glass or reinforced glass, or a flexible substrate formed of a thin film made of plastic, metal, or a combination thereof. Furthermore, the substrate SUB may be a transparent substrate, but it is not limited thereto. For instance, the substrate SUB may be a translucent substrate, an opaque substrate, or a reflective substrate. In other words, in the disclosure, the material or property of the substrate SUB is not particularly limited.

The first partition wall PW1 and the second partition wall PW2 may be disposed in an area on the substrate SUB, e.g., in a light emitting area EMA, at positions spaced apart from each other. In an embodiment, the first and second partition walls PW1 and PW2 may be disposed on the same layer of the substrate SUB at positions spaced apart from each other by a distance in a first direction DR1 (e.g., a lateral direction), and each extend in a second direction DR2 (e.g., a vertical direction) intersecting with the first direction DR1. In an embodiment, the first and second partition walls PW1 and PW2 may have substantially the same structure, shape, and/or height, but the disclosure is not limited thereto.

The first electrode ELT1 and the second electrode ELT2 may be respectively disposed on the first partition wall PW1 and the second partition wall PW2 and respectively protrude in shapes corresponding to the first and second partition walls PW1 and PW2. The first and second electrodes ELT1 and ELT2 may be spaced apart from each other by a distance in the first direction DR1, and each may extend in the second direction DR2 intersecting with the first direction DR1. For example, the first and second electrodes ELT1 and ELT2 may be disposed in parallel to face each other in the first direction DR1, in at least one area on the substrate SUB (e.g., in at least light emitting area EMA), and extend in the second direction DR2 intersecting with the first direction DR1.

In an embodiment, the first and second electrodes ELT1 and ELT2 may be disposed on the same layer and/or height, but the disclosure is not limited thereto. For example, the shapes and/or mutual arrangement relationship of the first and second electrodes ELT1 and ELT2 may be changed in various ways.

In an embodiment, the first electrode ELT1 may be electrically connected to the first power line PL1 through the first connection electrode CNL1. In an embodiment, the first electrode ELT1 and the first connection electrode CNL1 may extend in different directions. For example, in case that the first connection electrode CNL1 extends in the first direction DR1, the first electrode ELT1 may extend in the second direction DR2 intersecting with the first direction DR1.

In an embodiment, the first electrode ELT1 may be integrally connected with the first connection electrode CNL1. For instance, the first electrode ELT1 may be formed to diverge in one way from the first connection electrode CNL1. However, the disclosure is not limited thereto. For example, in an embodiment, the first electrode ELT1 and the first connection electrode CNL1 may be separately formed and electrically connected to each other through at least one contact hole, via hole, or the like.

In an embodiment, the first electrode ELT1 and/or the first connection electrode CNL1 may be integrally connected with the first power line PL1. In an embodiment, the first electrode ELT1 and/or the first connection electrode CNL1 may be formed separately from the first power line PL1 and electrically connected to the first power line PL1 via at least one contact hole and/or at least one circuit element. Hence, first power to be supplied to the first power line PL1 may be transmitted to the first electrode ELT1.

In an embodiment, the second electrode ELT2 may be electrically connected to the second power line PL2 through the second connection electrode CNL2. In an embodiment, the second electrode ELT2 and the second connection electrode CNL2 may extend in different directions. For example, in case that the second connection electrode CNL2 extends in the first direction DR1, the second electrode ELT2 may extend in the second direction DR2 intersecting with the first direction DR1.

In an embodiment, the second electrode ELT2 may be integrally connected with the second connection electrode CNL2. For instance, the second electrode ELT2 may be formed to diverge in one way from the second connection electrode CNL2. However, the disclosure is not limited thereto. For example, in an embodiment, the second electrode ELT2 and the second connection electrode CNL2 may be separately formed and electrically connected to each other through at least one contact hole, via hole, or the like.

In an embodiment, the second electrode ELT2 and/or the second connection electrode CNL2 may be integrally connected with the second power line PL2. In an embodiment, the second electrode ELT2 and/or the second connection electrode CNL2 may be formed separately from the second power line PL2 and electrically connected to the second power line PL2 via at least one contact hole and/or at least one circuit element. Hence, second power to be supplied to the second power line PL2 may be transmitted to the second electrode ELT2.

In an embodiment, the first power supply and the second power supply may have different potentials. For example, a difference in potential between the first power supply and the second power supply may be equal to or greater than a threshold voltage of the light emitting elements LD. In an embodiment, the first power supply and the second power supply may have potentials enabling at least one light emitting element LD disposed between the first and second electrodes ELT1 and ELT2 to be connected in a forward direction. In other words, the voltage between the first power supply and the second power supply may have a value enabling at least one light emitting element LD included in the light emitting device to emit light.

In an embodiment, the light emitting elements LD may be connected in parallel with each other between the first electrode ELT1 and the second electrode ELT2. For example, the light emitting elements LD may be arranged in the first direction DR1, e.g., in the lateral direction, between the first and second electrodes ELT1 and ELT2 in an area in which the first electrode ELT1 and the second electrode ELT2 may be disposed to face each other.

In an embodiment, an end of each of the light emitting elements LD may overlap at least the first contact electrode CNE1. For example, as illustrated in FIG. 4, the first ends EP1 of the light emitting elements LD may overlap the first electrode ELT1 and the first contact electrode CNE1. In other embodiments, as illustrated in FIG. 5, the first ends EP1 of the light emitting elements LD may overlap only the first contact electrode CNE1 without overlapping the first electrode ELT1. The first ends EP1 of the light emitting elements LD may be electrically connected to the first electrode ELT1 through the first contact electrode CNE1.

In an embodiment, another end of each of the light emitting elements LD may overlap at least the second contact electrode CNE2. For example, as illustrated in FIG. 4, the second ends EP2 of the light emitting elements LD may overlap the second electrode ELT2 and the second contact electrode CNE2. In other embodiments, as illustrated in FIG. 5, the second ends EP2 of the light emitting elements LD may overlap only the second contact electrode CNE2 without overlapping the second electrode ELT2. The second ends EP2 of the light emitting elements LD may be electrically connected to the second electrode ELT2 through the second contact electrode CNE2.

However, the disclosure is not limited thereto. For example, in an embodiment of the disclosure, at least one of the opposite ends of the light emitting elements LD, e.g., at least one of the first and second ends EP1 and EP2, may be brought into direct contact with the first or second electrode ELT1 or ELT2 and thus be electrically connected to the first or second electrode ELT1 or ELT2.

Although FIGS. 4 and 5 illustrate that the light emitting elements LD may be uniformly oriented in any one direction, e.g., in the first direction DR1, the disclosure is not limited thereto. For example, at least one of the light emitting elements LD may be disposed in a diagonal direction between the first and second electrodes ELT1 and ELT2 or may not be properly connected between the first electrode ELT1 and the second electrode ELT2.

In an embodiment, each of the light emitting elements LD may be formed of a rod-type light emitting diode which may be made of material having an inorganic crystal structure and have a subminiature size, e.g., ranging from the nanoscale to the microscale. For example, each light emitting element LD may be a subminiature rod-type light emitting diode which has a diameter D and/or a length L ranging from the nanoscale to the microscale, as illustrated in FIGS. 1A to 3B.

In an embodiment, the light emitting elements LD may be prepared in a diffused form in a solution, and supplied to a light emitting area EMA defined in the light emitting device by an inkjet printing scheme, a slit coating scheme, or the like. For example, the light emitting elements LD may be mixed with a volatile solvent and dropped onto each light emitting area EMA. Here, if the first power and the second power are respectively applied to the first and second electrodes ELT1 and ELT2 through the first and second power lines PL1 and PL2, an electric field may be formed between the first and second electrodes ELT1 and ELT2, whereby the light emitting elements LD may be self-aligned between the first and second electrodes ELT1 and ELT2. After the light emitting elements LD have been aligned, the solvent may be removed by a volatilization scheme or other schemes. In this way, the light emitting elements LD may be reliably arranged between the first and second electrodes ELT1 and ELT2. Furthermore, in an embodiment, since the first contact electrode CNE1 and the second contact electrode CNE2 may be respectively formed on the opposite ends of the light emitting elements LD, e.g., on the first end EP1 and the second end EP2, the light emitting elements LD may be more reliably connected between the first and second electrodes ELT1 and ELT2.

In an embodiment, the first contact electrode CNE1 may be formed to cover both the first ends EP1 of the light emitting elements LD and at least an area of the first electrode ELT1, whereby the first ends EP1 of the light emitting elements LD may be physically and/or electrically connected to the first electrode ELT1. Likewise, the second contact electrode CNE2 may be formed to cover both the second ends EP2 of the light emitting elements LD and at least an area of the second electrode ELT2, whereby the second ends EP2 of the light emitting elements LD may be physically and/or electrically connected to the second electrode ELT2.

In case that the first power is applied to the first ends EP1 of the light emitting elements LD via the first power line PL1, the first electrode ELT1, etc., and the second power is applied to the second ends EP2 of the light emitting elements LD via the second power line PL2, the second electrode ELT2, etc., at least one light emitting element LD that is connected in the forward direction between the first and second electrodes ELT1 and ELT2 may emit light. Consequently, the light emitting device may emit light.

In an embodiment of the disclosure, the light emitting device may include at least one groove GRV extending in the first direction DR1 intersecting with the first and second electrodes ELT1 and ELT2 (e.g., at right angles) in at least an area including the light emitting area EMA. For example, the light emitting device may include multiple grooves GRV formed in an insulating layer disposed between the substrate SUB and the light emitting elements LD. In an embodiment, the grooves GRV may be arranged in parallel to each other in the corresponding light emitting area EMA in the second direction DR2 intersecting with the first direction DR1. However, the disclosure is not limited to the foregoing structure and, for example, the shape and/or arrangement of the grooves GRV formed in each light emitting area EMA may be changed in various ways.

In an embodiment of the disclosure, the light emitting device may include light emitting elements LD each of which may be disposed on any one groove GRV such that the light emitting element LD may be disposed between the first and second electrodes ELT1 and ELT2. For example, at least some of the light emitting elements LD distributed in each light emitting area EMA may be disposed between the first and second electrodes ELT1 and ELT2 such that they may be located in any one of the grooves GRV formed in the corresponding light emitting area EMA.

According to the foregoing embodiment, at least one groove GRV extending in a direction intersecting with the first and second electrodes ELT1 and ELT2 may be formed in the light emitting device. For example, after at least one groove GRV is formed in one surface of the substrate SUB on which the first and second electrodes ELT1 and ELT2 may be formed, light emitting elements LD may be supplied into each light emitting area EMA. Consequently, the light emitting elements LD may be aligned between the first and second electrodes ELT1 and ELT2 with more uniform directionality. Therefore, according to the foregoing embodiment, the light emitting elements LD may be more uniformly aligned in the light emitting area EMA.

Figure 6:
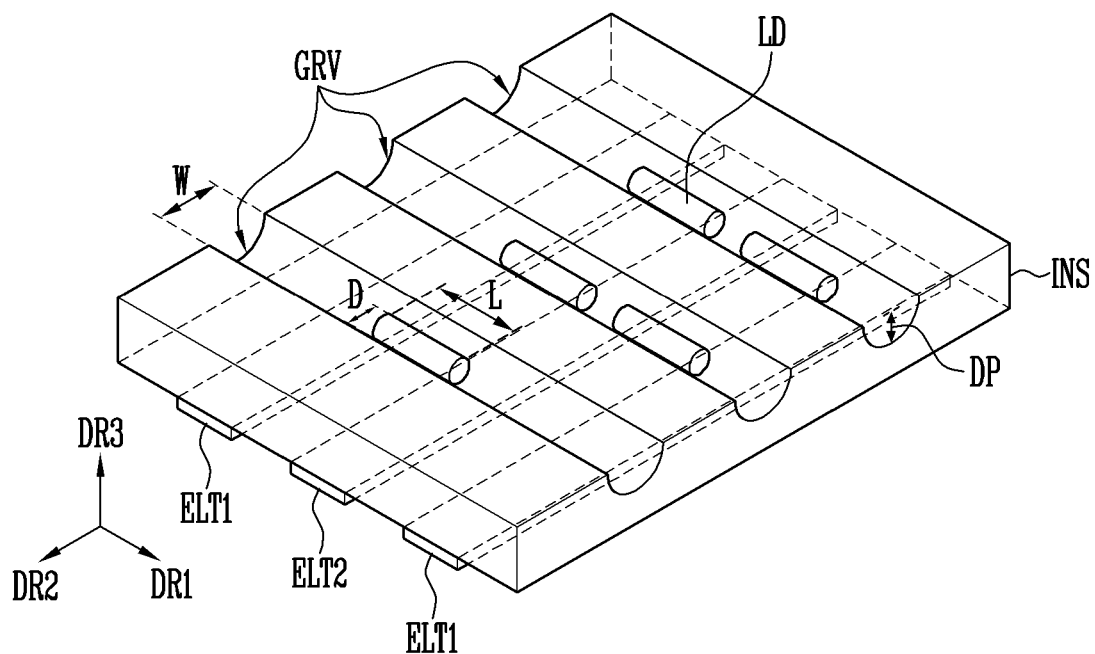
FIG. 6 is a schematic perspective diagram illustrating first and second electrodes, a groove, and light emitting elements in accordance with an embodiment of the disclosure.

FIG. 6 is a schematic perspective diagram illustrating first and second electrodes ELT1 and ELT2, a groove GRV, and light emitting elements LD in accordance with an embodiment of the disclosure. FIG. 6 schematically illustrates mutual arrangement relationship of the first and second electrodes ELT1 and ELT2, the groove GRV, and the light emitting elements LD, focused on an area of the light emitting area EMA illustrated in FIG. 4 (e.g., an area disposed between the first and second electrodes ELT1 and ELT2 that face each other). In the description of an embodiment of FIG. 6, like reference numerals are used to designate components similar or equal to those of the embodiments of FIGS. 4 and 5, and detailed explanation thereof will be omitted.

Referring to FIGS. 4 to 6, a light emitting device in accordance with an embodiment of the disclosure may further include an insulating layer INS formed on the substrate SUB on which the first and second electrodes ELT1 and ELT2 may be formed. In an embodiment, the insulating layer INS may include at least one groove GRV extending in the first direction DR1 intersecting with the extension direction (e.g., the second direction DR2) of the first and second electrodes ELT1 and ELT2. Multiple light emitting elements LD may be disposed on the at least one groove GRV.

Here, the insulating layer INS may be partially open on multiple contact portions (not illustrated) to provide for electrical connection between the first and second electrodes ELT1 and ELT2 and the light emitting elements LD. Each groove GRV may have an overall shape extending in the first direction DR1, and discontinuously extend in the first direction DR1 in a shape in which the groove GRV may be partially disconnected or open on an area corresponding to each contact portion. For example, each groove GRV may continuously extend in the first direction DR1 in at least an area between the first and second electrodes ELT1 and ELT2, and be partially removed in an area over each of the first and second electrodes ELT1 and ELT2. A detailed description of connection structure between the first and second electrodes ELT1 and ELT2 and the light emitting elements LD will be made below.

In an embodiment, the insulating layer INS may include at least one organic insulating layer. Furthermore, the insulating layer INS may selectively further include at least one inorganic insulating layer. For example, the insulating layer INS may be formed of an organic insulating layer in at least an upper area in which the groove GRV may be formed.

In an embodiment, light emitting elements LD disposed in at least one groove GRV may have an arrangement shape corresponding to the shape of the corresponding groove GRV. For example, each of the light emitting elements LD may be a rod-type light emitting diode. The rod-type light emitting diode may be arranged to have a length L extending in the first direction DR1 in which the corresponding groove GRV extends.

In an embodiment, each groove GRV may be formed to stably receive at least one light emitting element LD located thereon. For example, each groove GRV may have, in the second direction DR2, a width W greater than a diameter D or a width of each of the light emitting elements LD. Furthermore, in an embodiment, each groove GRV may have, in a third direction DR3 perpendicular to the first and second directions DR1 and DR2, a depth DP corresponding to a half or more of the thickness of each of the light emitting elements LD (the diameter D in the case where the light emitting elements LD each have a cylindrical shape), but the depth DP of the groove GRV is not limited thereto.

In fabricating the light emitting device according to the foregoing embodiment, the groove GRV extending in the first direction DR1 intersecting with the first and second electrodes ELT1 and ELT2 may be formed in the insulating layer INS disposed on the first and second electrodes ELT1 and ELT2, the light emitting elements LD may be supplied onto the insulating layer INS. The light emitting elements LD may be aligned between the first and second electrodes ELT1 and ELT2 with more uniform directionality by the groove GRV in the surface of the insulating layer INS. For example, compared to the case where the groove GRV may not be formed, the number of light emitting elements LD disposed in the lateral direction along the first direction DR1 between the first and second electrodes ELT1 and ELT2 among the light emitting elements LD supplied to the light emitting area EMA may be increased.

Figure 7:
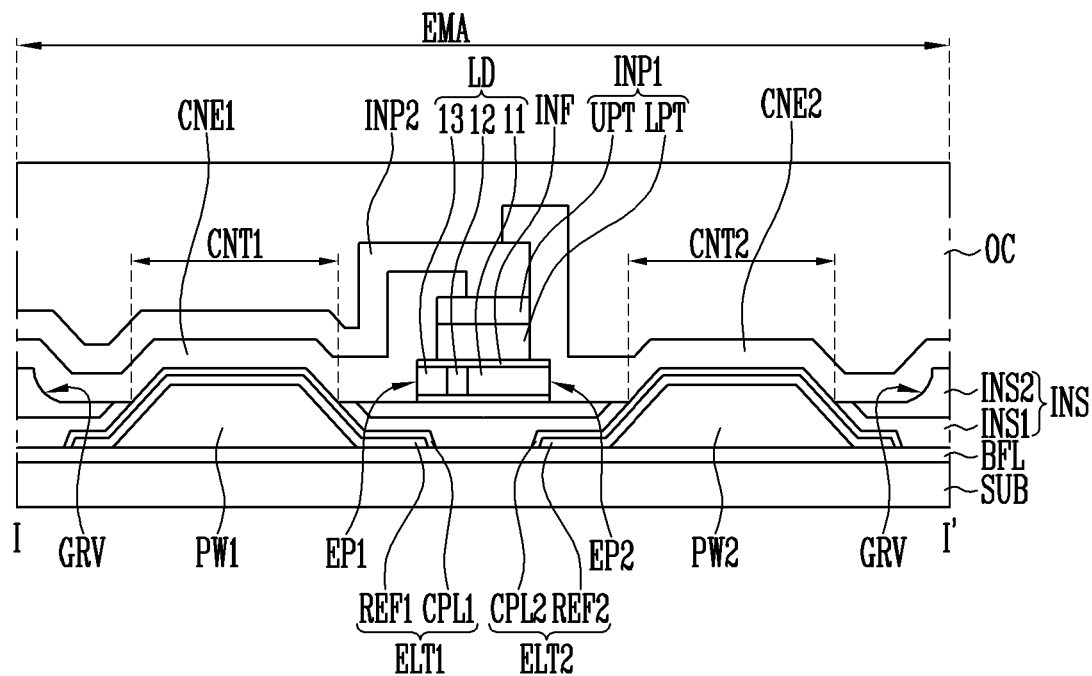
FIGS. 7 and 8 are schematic sectional diagrams illustrating different embodiments of a sectional diagram taken along line I-I' of FIG. 4.
Figure 8:
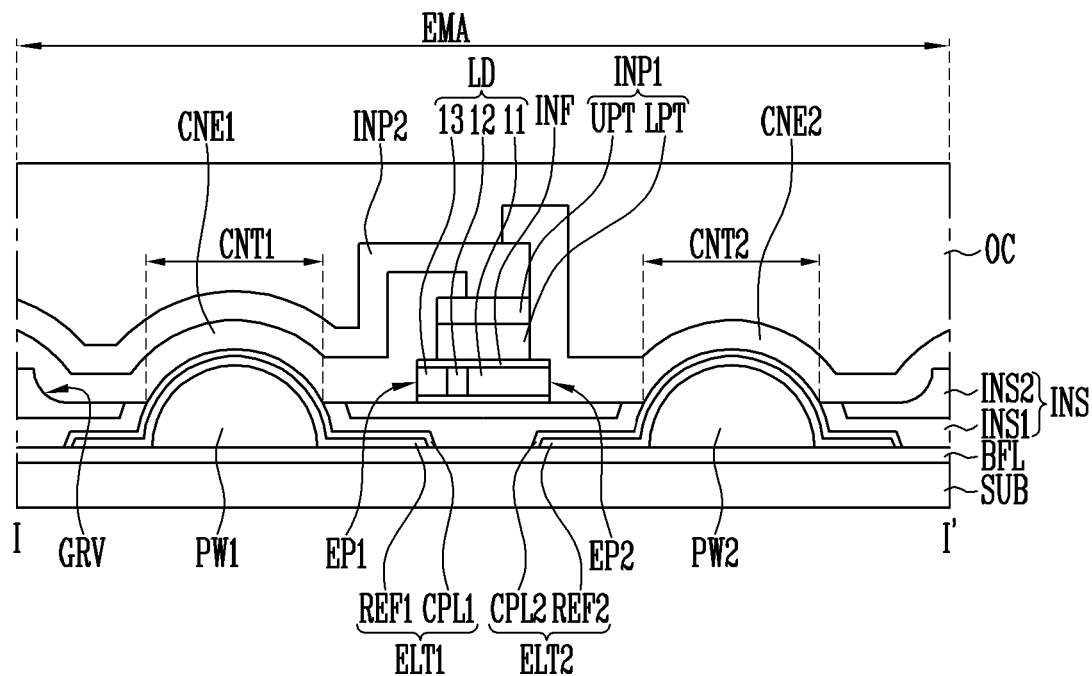
Figure 9:
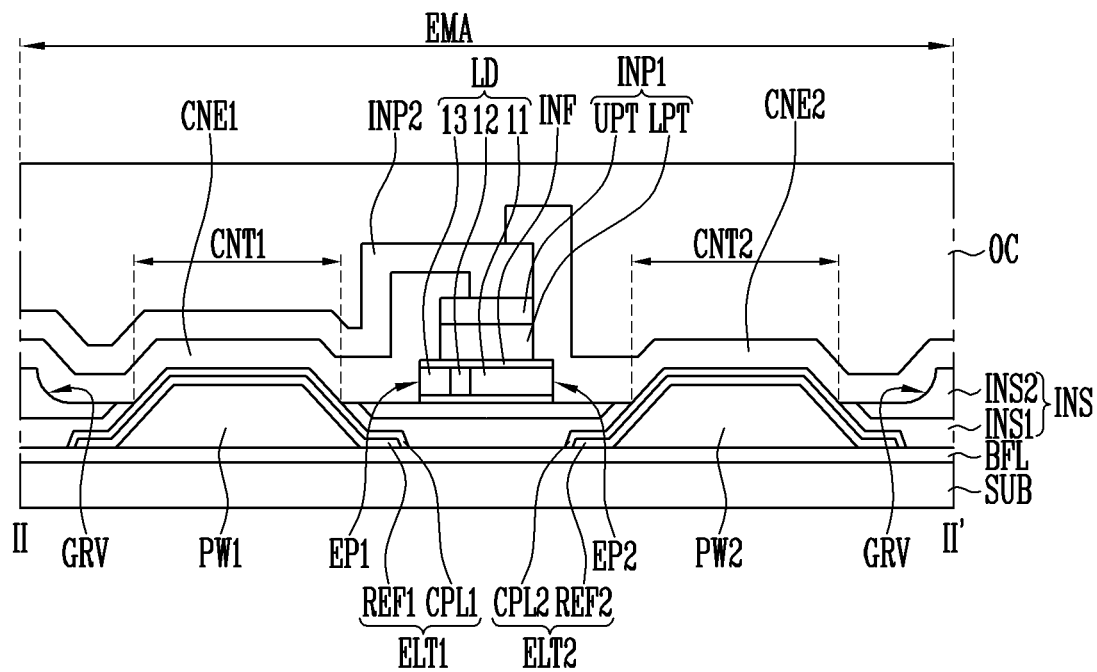
FIG. 9 is a schematic sectional diagram illustrating an embodiment of a sectional diagram taken along line II-II' of FIG. 5.

FIGS. 7 and 8 are schematic sectional diagrams illustrating different embodiments of a sectional diagram taken along line I-I' of FIG. 4, and particularly, illustrate different embodiments related to the shapes of the first and second partition walls PW1 and PW2. FIG. 9 is a schematic sectional diagram illustrating an embodiment of a sectional diagram taken along line II-II' of FIG. 5, and particularly, illustrates an embodiment where the light emitting elements LD may not overlap the first and second electrodes ELT1 and ELT2.

Referring to FIGS. 4 to 9, the light emitting device in accordance with an embodiment of the disclosure may include a substrate SUB, first and second electrodes ELT1 and ELT2 disposed on the substrate SUB, multiple light emitting elements LD connected between the first and second electrodes ELT1 and ELT2, at least one insulating layer INS disposed between the light emitting elements LD and the substrate SUB on which the first and second electrodes ELT1 and ELT2 may be formed, and first and second contact electrodes CNE1 and CNE2 that respectively connect first and second ends EP1 and EP2 of the light emitting elements LD to the first and second electrodes ELT1 and ELT2. Furthermore, the light emitting device may further include at least one of a buffer layer BFL disposed between the substrate SUB and the first and second electrodes ELT1 and ELT2, a first partition wall PW1 disposed between the substrate SUB and an area of the first electrode ELT1, a second partition wall PW2 disposed between the substrate SUB and an area of the second electrode ELT2, a first insulating pattern INP1 disposed over areas of the light emitting elements LD, a second insulating pattern INP2 disposed over the first contact electrode CNE1, and an overcoat layer OC that covers one surface of the substrate SUB on which the first and second electrodes ELT1 and ELT2, the light emitting elements LD, and the first and second contact electrodes CNE1 and CNE2, etc. may be formed.

In an embodiment, the substrate SUB may form a base component of the light emitting device and be a rigid substrate or a flexible substrate. Furthermore, the substrate SUB may be a transparent substrate, but it is not limited thereto. In other words, in the disclosure, the material or property of the substrate SUB is not particularly limited.

The buffer layer BFL may be formed on one surface of the substrate SUB. The buffer layer BFL may prevent impurities from diffusing into electrodes, lines, and/or a circuit element that may be disposed on the buffer layer BFL. In an embodiment, the buffer layer BFL may be formed of a single layer, or may be formed of multiple layers having at least two layers. In the case where the buffer layer BFL has a multilayer structure, the respective layers may be formed of the same material or different materials. In an embodiment, the buffer layer BFL may be omitted.

The first partition wall PW1 and the second partition wall PW2 may be disposed on the one surface of the substrate SUB on which the buffer layer BFL may be formed. In an embodiment, the first and second partition walls PW1 and PW2 may be disposed on a surface of the substrate SUB at positions spaced apart from each other. For example, the first and second partition walls PW1 and PW2 may be disposed on the same layer on the substrate SUB at positions spaced apart from each other by a distance. In an embodiment, the first and second partition walls PW1 and PW2 may have substantially the same structure, shape, and/or height, but the disclosure is not limited thereto.

In an embodiment, each of the first and second partition walls PW1 and PW2 may include an insulating material having an inorganic material and/or an organic material. Furthermore, each of the first and second partition walls PW1 and PW2 may have a single-layer structure or a multi-layer structure. In other words, the material and/or the stacked structure of each of the first and second partition walls PW1 and PW2 may be changed in various ways rather than being particularly limited.

Each of the first and second partition walls PW1 and PW2 may have various shapes. For example, as illustrated in FIG. 7, each of the first and second partition walls PW1 and PW2 may have the cross-sectional shape of a trapezoid that may be reduced in width from a bottom to a top thereof. In an embodiment, as illustrated in FIG. 8, each of the first and second partition walls PW1 and PW2 may have a semi-circular or semi-elliptical cross-section the width of which may be gradually reduced upward. In other words, the shape of each of the first and second partition walls PW1 and PW2 may be changed in various ways rather than being particularly limited. In an embodiment, at least one of the first and second partition walls PW1 and PW2 may be omitted or changed in position.

The first electrode ELT1 and the first contact electrode CNE1 may be disposed over the first partition wall PW1. The second electrode ELT2 and the second contact electrode CNE2 may be disposed over the second partition wall PW2. At least one electrode and/or insulating layer disposed over each of the first and second partition walls PW1 and PW2 may have a shape corresponding to the shape of a corresponding first or second partition wall PW1 or PW2, but the disclosure is not limited thereto.

The first and second electrodes ELT1 and ELT2 may be disposed at positions spaced apart from each other on the substrate SUB on which the first and second partition walls PW1 and PW2 may be disposed. For example, the first electrode ELT1 may be disposed on the first partition wall PW1 to cover the first partition wall PW1. The second electrode ELT2 may be disposed on the second partition wall PW2 to cover the second partition wall PW2. In an embodiment, any one of the first and second electrodes ELT1 and ELT2 may be an anode electrode, and another may be a cathode electrode.

The first and second electrodes ELT1 and ELT2 may respectively have shapes corresponding to those of the first and second partition walls PW1 and PW2. For example, the first electrode ELT1 may have an inclined surface or a curved surface corresponding to the shape of the first partition wall PW1, and the second electrode ELT2 may have an inclined surface or a curved surface corresponding to the shape of the second partition wall PW2. In an embodiment, the first and second partition walls PW1 and PW2 may not be provided in the light emitting device. Each of the first and second electrodes ELT1 and ELT2 may have a substantially planar shape.

In an embodiment, the first and second electrodes ELT1 and ELT2 may be disposed on the same plane on the substrate SUB and have substantially the same height. As such, if the first and second electrodes ELT1 and ELT2 have the same height, the light emitting elements LD may be more reliably connected between the first and second electrodes ELT1 and ELT2. However, the disclosure is not limited thereto. For example, the shapes, the structures, and/or the mutual disposition relationship of the first and second electrodes ELT1 and ELT2 may be changed in various ways.

In an embodiment, each of the first and second electrodes ELT1 and ELT2 may have a single-layer structure or a multilayer structure, and the cross-sectional structure thereof is not particularly limited. For example, the first electrode ELT1 may have a multilayer structure including a first reflective electrode REF1 and a first conductive capping layer CPL1. The second electrode ELT2 may have a multilayer structure including a second reflective electrode REF2 and a second conductive capping layer CPL2.

Each of the first and second reflective electrodes REF1 and REF2 may be formed of conductive material having a reflectivity. For example, each of the first and second reflective electrodes REF1 and REF2 may include at least one of metals such as Ag, Mg, Al, Pt, Pd, Au, Ni, Nd, Ir, Cr, or an alloy thereof; however, the disclosure is not limited thereto. Each of the first and second reflective electrodes REF1 and REF2 may be formed of various reflective conductive materials.

The first and second reflective electrodes REF1 and REF2 may enable light emitted from the opposite ends of each of the light emitting elements LD, e.g., the first and second ends EP1 and EP2 of the light emitting elements LD, to travel in a direction (e.g., in a frontal direction) in which an image may be displayed. Particularly, if each of the first and second reflective electrodes REF1 and REF2 has an inclination or curvature corresponding to the shape of a corresponding one of the first and second partition walls PW1 and PW2, light emitted from the first and second ends EP1 and EP2 of each of the light emitting elements LD may be reflected by the first and second reflective electrodes REF1 and REF2, whereby the light may travel more reliably in the frontal direction of the light emitting device (e.g., in an upward direction of the substrate SUB). Thereby, the efficiency of light emitted from the light emitting elements LD may be enhanced.

In an embodiment of the disclosure, each of the first and second partition walls PW1 and PW2 may also function as a reflective member. For example, the first and second partition walls PW1 and PW2, along with the first and second reflective electrodes REF1 and REF2 provided on the first and second partition walls PW1 and PW2, may function as reflective components for enhancing the efficiency of light emitted from each of the light emitting elements LD.

The first and second conductive capping layers CPL1 and CPL2 may be respectively selectively disposed over the first and second reflective electrodes REF1 and REF2. For example, the first conductive capping layer CPL1 may be disposed over the first reflective electrode REF1 to cover the first reflective electrode REF1. The second conductive capping layer CPL2 may be provided over the second reflective electrode REF2 to cover the second reflective electrode REF2.

Each of the first and second conductive capping layers CPL1 and CPL2 may be formed of transparent conductive material such as ITO, IZO, or a combination thereof, so as to minimize loss of light emitted from the light emitting element LD. However, the disclosure is not limited thereto.

For example, the material of the first and second conductive capping layers CPL1 and CPL2 may be changed in various ways.

The first and second conductive capping layers CPL1 and CPL2 may prevent the first and second reflective electrodes REF1 and REF2 from being damaged by defects which may occur during a process of fabricating the light emitting device, and may reinforce adhesive force between the substrate SUB and the first and second reflective electrodes REF1 and REF2. In an embodiment, at least one of the first and second conductive capping layers CPL1 and CPL2 may be omitted.

The insulating layer INS may be formed on the substrate SUB on which the first and second electrodes ELT1 and ELT2 may be disposed. In an embodiment of the disclosure, at least one groove GRV extending in the first direction DR1 intersecting with the second direction DR2 in which the first and second electrodes ELT1 and ELT2 extend may be formed on the surface of the insulating layer INS at least between the first and second electrodes ELT1 and ELT2.

In an embodiment, the insulating layer INS may include at least one organic insulating layer. Furthermore, the insulating layer INS may selectively further include at least one inorganic insulating layer. For example, the insulating layer INS may include at least one inorganic insulating layer (hereinafter, referred to as "first insulating layer INS1") disposed on the substrate SUB on which the first and second electrodes ELT1 and ELT2 may be formed, and an organic insulating layer (hereinafter, referred to as "second insulating layer INS2") disposed on the first insulating layer INS1.

In an embodiment, the first insulating layer INS1 may include, e.g., silicon nitride $SiN_x$, but the material for forming the first insulating layer INS1 is not limited thereto. For example, the first insulating layer INS1 may be configured of at least one of various known inorganic insulating layer materials. Furthermore, the first insulating layer INS1 may be configured of a single layer or multiple layers, and the sectional structure thereof is not particularly limited.

In an embodiment, the second insulating layer INS2 may include polymeric organic material, and be formed to have flexibility. For example, the second insulating layer INS2 may be a polyimide coating layer formed of polyimide, but the material for forming the second insulating layer INS2 is not limited thereto. For example, the second insulating layer INS2 may be formed of at least one of various known organic insulating layer materials. Furthermore, the second insulating layer INS2 may be configured of a single layer or multiple layers, and the sectional structure thereof is not particularly limited.

At least one groove GRV extending in the first direction DR1 intersecting with the first and second electrodes ELT1 and ELT2 may be formed in the surface of the second insulating layer INS2. In an embodiment, the groove GRV may be formed by a rubbing scheme, but the method of forming the groove GRV is not limited thereto. Thanks to the groove GRV formed in the second insulating layer INS2, the light emitting elements LD may be disposed over the second insulating layer INS2 with more uniform directionality. In other words, in an embodiment, the second insulating layer INS2 may form a polymer orientation layer.

In an embodiment, the insulating layer INS may include first and second contact portions CNT1 and CNT2 respectively allowing areas of the first and second electrodes ELT1 and ELT2 to be exposed. For example, each of the first and second insulating layers INS1 and INS2 may be partially open so that the first and second electrodes ELT1 and ELT2 may be exposed over areas of the first and second electrodes ELT1 and ELT2.

In an embodiment, multiple light emitting elements LD may be disposed on the substrate SUB on which the insulating layer INS may be disposed. The light emitting elements LD may be disposed over the second insulating layer INS2 and disposed between the first electrode ELT1 and the second electrode ELT2 in a plan view of the substrate SUB. Each of the light emitting elements LD may have a first end EP1 and a second end EP2 on respective opposite sides thereof in the longitudinal direction (L).

In an embodiment, the light emitting elements LD may be horizontally disposed on a surface of the substrate SUB. Furthermore, the light emitting elements LD may be arranged in the lateral direction between the first and second electrodes ELT1 and ELT2 such that the longitudinal direction (L) thereof corresponds to the first direction DR1. For example, the first ends EP1 of the light emitting elements LD may be disposed to face the first electrode ELT1. The second ends EP2 of the light emitting elements LD may be disposed to face the second electrode ELT2.

In an embodiment, the first and second ends EP1 and EP2 of the light emitting elements LD may respectively overlap the first and second electrodes ELT1 and ELT2, as illustrated in FIGS. 7 and 8. In an embodiment, the first and second ends EP1 and EP2 of the light emitting elements LD may respectively overlap only the first and second contact electrodes CNE1 and CNE2 without overlapping the first and second electrodes ELT1 and ELT2, as illustrated in FIG. 9.

The first and second ends EP1 and EP2 of the light emitting elements LD may be electrically connected to the first and second electrodes ELT1 and ELT2 through the first and second contact electrodes CNE1 and CNE2, respectively.

In an embodiment of the disclosure, the light emitting elements LD may be aligned between the first and second electrodes ELT1 and ELT2 to have more uniform directionality, by a combination of a physical alignment scheme using the groove GRV formed in the surface of the second insulating layer INS2 and an electrical alignment scheme using an electric field formed by applying a voltage between the first and second electrodes ELT1 and ELT2. For example, the light emitting elements LD may be induced to be disposed in the groove GRV, and may be arranged such that the first and second ends EP1 and EP2 thereof respectively face the first and second electrodes ELT1 and ELT2. Therefore, the light emitting elements LD may be arranged between the first and second electrodes ELT1 and ELT2 such that each light emitting element LD may be disposed on any one groove GRV in the first direction DR1 in which the groove GRV extends.

FIGS. 4 to 9 illustrate only valid light emitting elements where the first and second ends EP1 and EP2 of each of the light emitting elements may be connected to the first and second electrodes ELT1 and ELT2. However, the light emitting device may not only include the valid light emitting elements but may also include at least one light emitting element (not illustrated) that may not be completely connected between the first and second electrodes ELT1 and ELT2.

In other words, at least some of the light emitting elements LD supplied to the light emitting area EMA of the light emitting device may be aligned between the first and second electrodes ELT1 and ELT2 and electrically connected to the first and second electrodes ELT1 and ELT2. Particularly, as described in an embodiment of the disclosure, in the case where the light emitting elements LD are aligned by a combination of the physical alignment scheme and the electrical alignment scheme, the number of light emitting elements LD aligned between the first and second electrodes ELT1 and ELT2 with uniform directionality may be further increased.

The first and second contact electrodes CNE1 and CNE2, etc. may be disposed on the substrate SUB on which the light emitting elements LD may be disposed. The first and second contact electrodes CNE1 and CNE2 may electrically connect the light emitting elements LD between the first and second electrodes ELT1 and ELT2.

In an embodiment, the first contact electrode CNE1 may be formed to cover not only the first ends EP1 of the light emitting elements LD but also the first contact portion CNT1. Hence, the first contact electrode CNE1 may be electrically connected to the light emitting elements LD by coming into contact with the light emitting elements LD on the first ends EP1 of the light emitting elements LD, and electrically connected to the first electrode ELT1 by coming into contact with the first electrode ELT1 on the first contact portion CNT1. In other words, the first ends EP1 of the light emitting elements LD and the first electrode ELT1 may be electrically connected to each other through the first contact electrode CNE1.

In an embodiment, the second contact electrode CNE2 may be formed to cover not only the second ends EP2 of the light emitting elements LD but also the second contact portion CNT2. Hence, the second contact electrode CNE2 may be electrically connected to the light emitting elements LD by coming into contact with the light emitting elements LD on the second ends EP2 of the light emitting elements LD, and electrically connected to the second electrode ELT2 by coming into contact with the second electrode ELT2 on the second contact portion CNT2. In other words, the second ends EP2 of the light emitting elements LD and the second electrode ELT2 may be electrically connected to each other through the second contact electrode CNE2.

In an embodiment of the disclosure, the light emitting device may include at least one insulating pattern (or an insulating layer) provided to secure electrical stability (e.g., insulating characteristics) between the first and second contact electrodes CNE1 and CNE2. For example, the light emitting device may include a first insulating pattern INP1 disposed on areas of the light emitting elements LD between the first and second contact electrodes CNE1 and CNE2, and a second insulating pattern INP2 that covers upper portions of the first insulating pattern INP1 and the first contact electrode CNE1.

In an embodiment, the first insulating pattern INP1 may be disposed over the light emitting elements LD to cover at least areas of the light emitting elements LD, and may be formed to allow the first and second ends EP1 and EP2 of the light emitting elements LD to be exposed. In an embodiment, the first insulating pattern INP1 may include at least one organic insulating layer and/or inorganic insulating layer, and the material or properties thereof are not particularly limited. For example, the first insulating pattern INP1 may include, e.g., silicon nitride $SiN_x$, but the material for forming the first insulating pattern INP1 is not limited thereto. Furthermore, the first insulating pattern INP1 may be configured of a single layer or multiple layers, and the sectional structure thereof is not particularly limited. For example, the first insulating pattern INP1 may be formed of multiple layers including a lower pattern layer LPT and an upper pattern layer UPT that may be formed of the same material or different materials, but the disclosure is not limited thereto.

The first contact electrode CNE1 described above may be disposed on the substrate SUB on which the first insulating pattern INP1, etc. may be formed. In an embodiment, one end of the first contact electrode CNE1 may be disposed on one end of the first insulating pattern INP1 that may be located on the first ends EP1 of the light emitting elements LD.

In an embodiment, the second insulating pattern INP2 may be formed, to cover the upper portions of the first insulating pattern INP1 and the first contact electrode CNE1, on the substrate SUB on which the first insulating pattern INP1 and the first contact electrode CNE1 may be formed. However, the second insulating pattern INP2 may be formed to allow the second ends EP2 of the light emitting elements LD to be exposed. In an embodiment, the second insulating pattern INP2 may include at least one organic insulating layer and/or inorganic insulating layer, and the material or properties thereof are not particularly limited. Furthermore, the second insulating pattern INP2 may include material equal to or different from that of the first insulating pattern INP1. For example, the second insulating pattern INP2 may include, e.g., silicon nitride $SiN_x$, but the material for forming the second insulating pattern INP2 is not limited thereto. Furthermore, the second insulating pattern INP2 may be configured of a single layer or multiple layers, and the sectional structure thereof is not particularly limited.

The second contact electrode CNE2 described above may be disposed on the substrate SUB on which the second insulating pattern INP2, etc. may be formed. In an embodiment, one end of the second contact electrode CNE2 may be disposed on one end of the second insulating pattern INP2 that may be adjacent to the second ends EP2 of the light emitting elements LD.

An overcoat layer OC may be disposed on the substrate SUB on which the first and second contact electrodes CNE1 and CNE2, etc. may be disposed. In an embodiment, the overcoat layer OC may be formed of a single layer or multiple layers. For example, the overcoat layer OC may include a thin film encapsulation layer which includes multiple inorganic insulating layers overlapping each other and at least one organic insulating layer interposed between the inorganic insulating layers. However, the material and/or sectional structure of the overcoat layer OC is not particularly limited, and may be changed in various ways.

According to the above-described embodiments, the efficiency and uniformity at which the light emitting elements LD may be aligned in the light emitting area EMA may be increased by a combination of the physical alignment scheme and the electrical alignment scheme. Consequently, emission characteristics of the light emitting device, e.g., emission luminance, emission efficiency and/or emission uniformity, can be enhanced.

FIGS. 10A to 10K are schematic sectional diagrams sequentially illustrating a method of fabricating the light emitting device illustrated in FIG. 7.

Figure 10A:
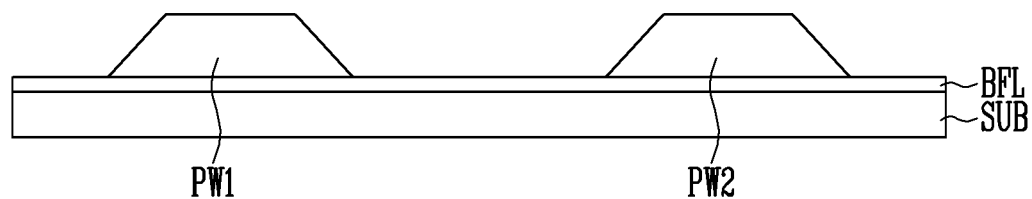
FIGS. 10A to 10K are schematic sectional diagrams sequentially illustrating a method of fabricating the light emitting device illustrated in FIG. 7.

Referring to FIG. 10A, a buffer layer BFL may be formed on one surface of a substrate SUB, and first and second partition walls PW1 and PW2 may be formed at positions spaced apart from each other on the substrate SUB on which the buffer layer BFL may be formed. In an embodiment, the first and second partition walls PW1 and PW2 may be formed through a process of forming an insulating layer including inorganic material and/or organic material and/or a patterning process (e.g., a mask process), and may be formed through various types of known processes. In an embodiment, the first and second partition walls PW1 and PW2 may be simultaneously formed using the same material on the same layer (or the same plane) on the substrate SUB, but the disclosure is not limited thereto.

Figure 10B:
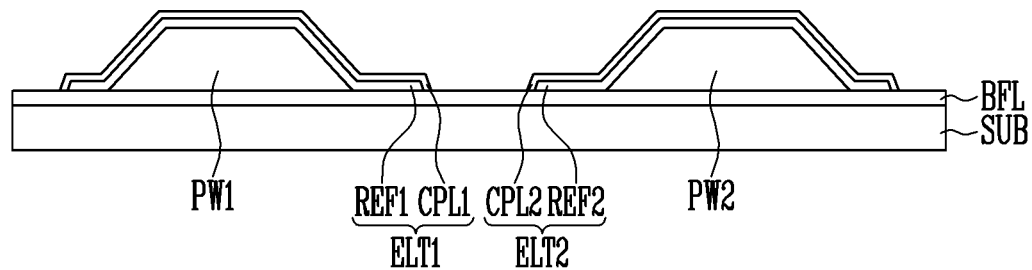

Referring to FIG. 10B, first and second electrodes ELT1 and ELT2 may be formed on the first and second partition walls PW1 and PW2. In an embodiment, the first and second electrodes ELT1 and ELT2 may be formed through a process of forming a conductive layer including at least one conductive material and/or a patterning process, and may be formed through various types of known processes.

In an embodiment, each of the first and second electrodes ELT1 and ELT2 may be formed of a single layer or multiple layers. For example, the first electrode ELT1 may be formed of multiple layers including a first reflective electrode REF1 and a first conductive capping layer CPL1. The second electrode ELT2 may be formed of multi-layers including a second reflective electrode REF2 and a second conductive capping layer CPL2. The step of forming the first and second electrodes ELT1 and ELT2 may include the step of forming the first and second reflective electrodes REF1 and REF2 respectively on the first and second partition walls PW1 and PW2, and the step of forming the first and second conductive capping layers CPL1 and CPL2 on the first and second reflective electrodes REF1 and REF2.

The first and second electrodes ELT1 and ELT2 may be simultaneously formed on the same layer on the substrate SUB, but the disclosure is not limited thereto. In the case where the first and second electrodes ELT1 and ELT2 may be simultaneously formed, the number of mask processes to be used to fabricate the light emitting device may be reduced or minimized.

Figure 10C:
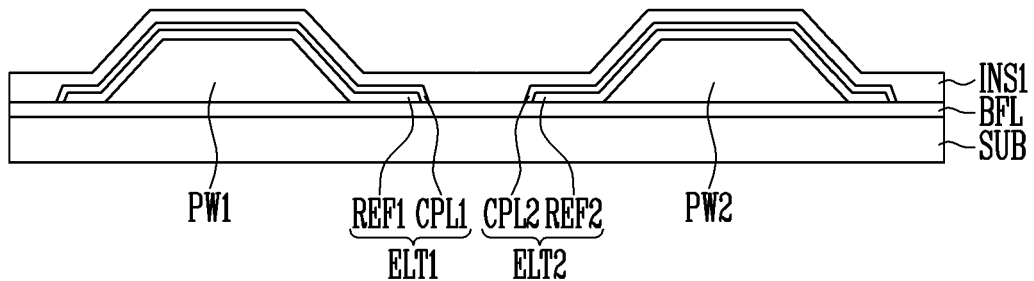
Figure 10D:
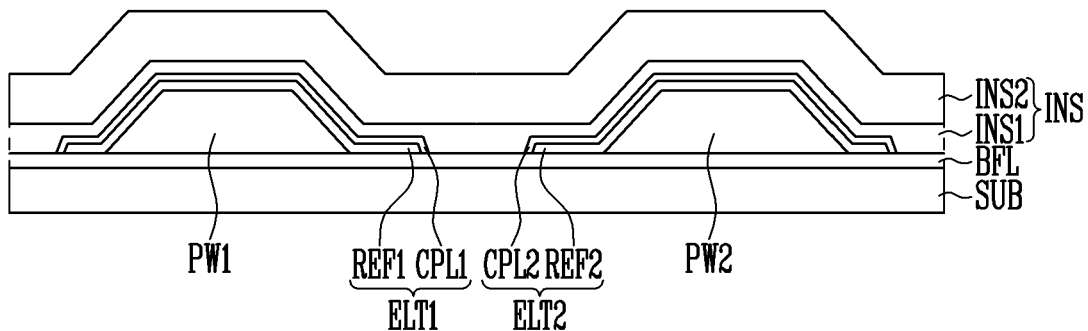

Referring to FIGS. 10C and 10D, at least one insulating layer INS may be formed on the substrate SUB on which the first and second electrodes ELT1 and ELT2 may be formed. For example, first and second insulating layers INS1 and INS2 may be successively formed on the substrate SUB on which the first and second electrodes ELT1 and ELT2 may be formed.

In an embodiment, the insulating layer INS may be formed through a deposition process of an insulating layer including inorganic material and/or organic material, and may be formed through various types of known processes. In an embodiment, the insulating layer INS may be formed of a single layer or multiple layers. For example, after at least one inorganic insulating layer, e.g., the first insulating layer INS1, is formed using at least one inorganic material, an organic insulating layer, e.g., the second insulating layer INS2, may be formed on the first insulating layer INS1 using at least one organic material. In an embodiment, the second insulating layer INS2 may be formed by, e.g., coating a polymeric organic layer including polyimide, but the material of the second insulating layer INS2 and/or the method of forming the second insulating layer INS2 is not limited thereto.

Figure 10E:
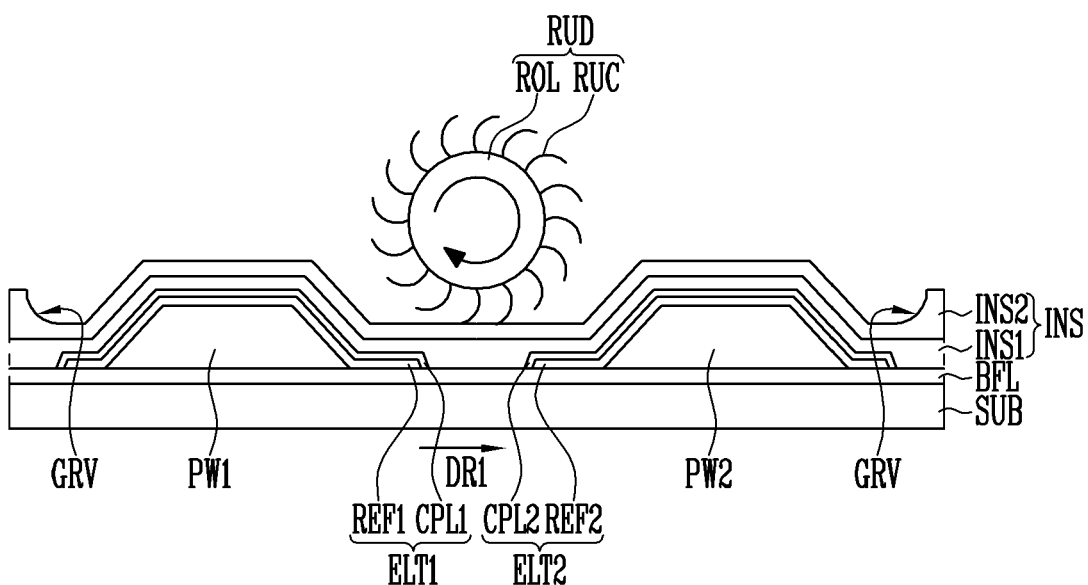

Referring to FIG. 10E, at least one groove GRV may be formed in the surface of the insulating layer INS e.g., the surface of at least the second insulating layer INS2. In an embodiment, the groove GRV may be formed by a rubbing scheme using a rubbing device RUD.

For example, the groove GRV may be formed in the surface of the second insulating layer INS2 by disposing the rubbing device RUD on the second insulating layer INS2 such that the rubbing device RUD comes into contact with the second insulating layer INS2, and pressing the second insulating layer INS2 while moving the substrate SUB and/or the rubbing device RUD in the first direction DR1 intersecting with the first and second electrodes ELT1 and ELT2 in one way or reciprocating ways at least once. In detail, the rubbing device RUD may include a roller ROL that is rotatable in at least one direction, and a rubbing cloth RUC wound around the roller ROL. In an embodiment, if at least one of the substrate SUB and the roller ROL is moved in the first direction DR1 while the rubbing cloth RUC makes contact with the surface of the second insulating layer INS2, at least one groove GRV intersecting with the first and second electrodes ELT1 and ELT2 may be formed in the surface of the second insulating layer INS2.

In an embodiment, the rubbing device RUD may be disposed on the second insulating layer INS2, and the second insulating layer INS2 may be pressed at intervals of a distance. Hence, for example, as illustrated in FIG. 4, grooves GRV extending in parallel to each other in a direction intersecting with the first and second electrodes ELT1 and ELT2 may be formed in the surface of the second insulating layer INS2. In an embodiment, the grooves GRV may be simultaneously formed or successively formed.

Figure 10F:
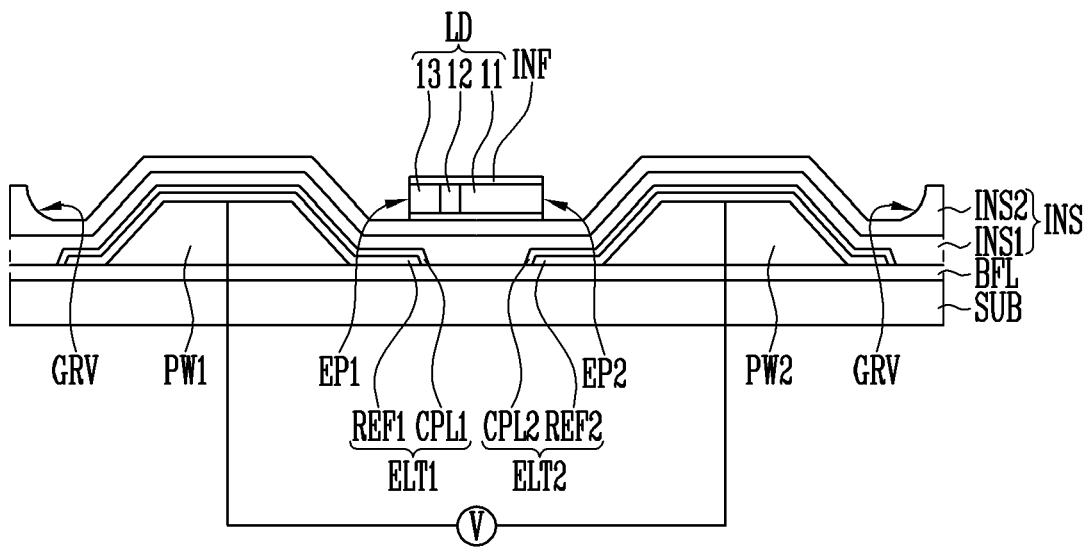

Referring to FIG. 10F, multiple light emitting elements LD may be supplied onto the insulating layer INS including the at least one groove GRV, and an electric field may be formed by applying a voltage (e.g., an AC voltage) between the first and second electrodes ELT1 and ELT2. In an embodiment, the light emitting elements LD may be supplied into a light emitting area EMA by applying a solution with multiple light emitting elements LD dispersed therein to the substrate SUB using an inkjet printing scheme, a slit coating scheme, or the like. However, the scheme of supplying the light emitting elements LD is not limited to the foregoing scheme, and the light emitting elements LD may be supplied to the light emitting area EMA in various other ways. In an embodiment, the electric field may be formed by applying an AC voltage between the first and second electrodes ELT1 and ELT2, but the type of voltage or signal to be applied between the first and second electrodes ELT1 and ELT2 is not limited thereto.

If the electric field is formed between the first and second electrodes ELT1 and ELT2, the light emitting elements LD may be aligned between the first and second electrodes ELT1 and ELT2. Here, the light emitting elements LD may be more uniformly aligned in the light emitting area EMA with more uniform directionality by the groove GRV formed in the surface of the insulating layer INS. For example, compared to a comparative example where the groove GRV is not formed, the number of light emitting elements LD uniformly and laterally disposed in the first direction DR1 between the first and second electrodes ELT1 and ELT2 may be increased. For example, the first ends EP1 of the light emitting elements LD may be disposed to face the first electrode ELT1. The second ends EP2 of the light emitting elements LD may be disposed to face the second electrode ELT2.

Figure 10G:
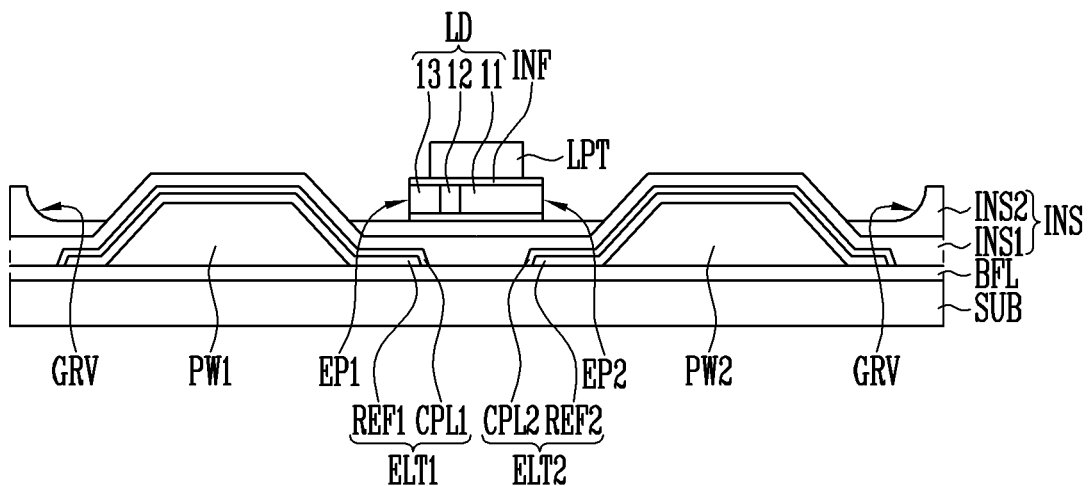

Referring to FIG. 10G, a first insulating pattern INP1, e.g., a lower pattern layer LPT of the first insulating pattern INP1, may be formed on the substrate SUB on which the light emitting elements LD may be arranged. For example, the lower pattern layer LPT may be formed on areas of the light emitting elements LD such that the first and second ends EP1 and EP2 of the light emitting elements LD may be exposed. In an embodiment, the lower pattern layer LPT may be formed through a process of forming an insulating layer including inorganic material and/or organic material and/or a patterning process (e.g., a mask process), and may be formed through various types of known processes.

Furthermore, at the step of forming the lower pattern layer LPT, the second insulating layer INS2 may be etched such that an area of the first insulating layer INS1 corresponding to each of the first and second electrodes ELT1 and ELT2 may be exposed. For example, during a mask process of patterning the lower pattern layer LPT, an opening may be formed in the second insulating layer INS2 over areas of the first and second electrodes ELT1 and ELT2.

Figure 10H:
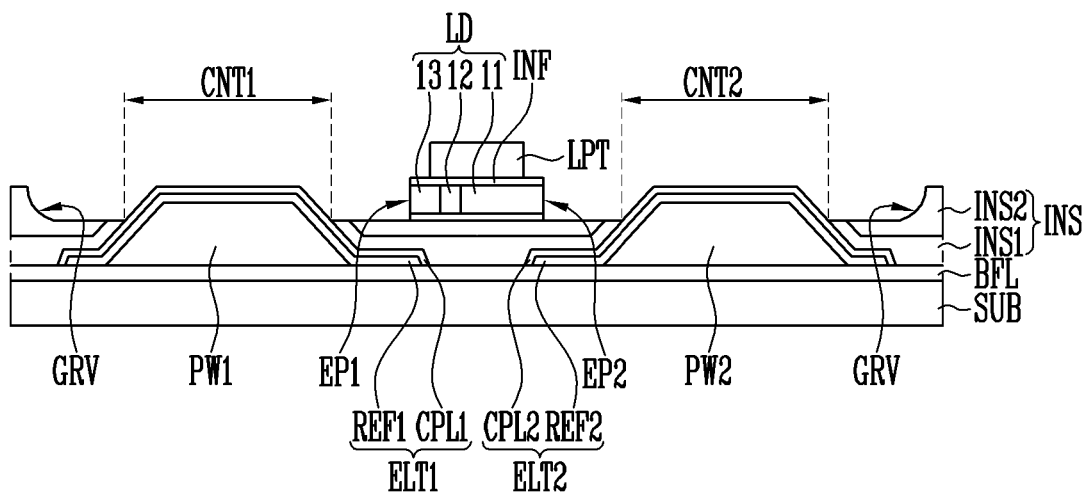

Referring to FIG. 10H, first and second contact portions CNT1 and CNT2 may be formed in the insulating layer INS by etching the first insulating layer INS1 such that an area of each of the first and second electrodes ELT1 and ELT2 may be exposed. Although in an embodiment the first and second contact portions CNT1 and CNT2 may be formed in the insulating layer INS by etching the first insulating layer INS1 after the second insulating layer INS2 has been etched, the disclosure is not limited thereto. For example, in an embodiment of the disclosure, the first and second contact portions CNT1 and CNT2 may be formed by etching the first and second insulating layers INS1 and INS2 together over an area of each of the first and second electrodes ELT1 and ELT2 such that the areas of the first and second electrodes ELT1 and ELT2 may be exposed.

Figure 10I:
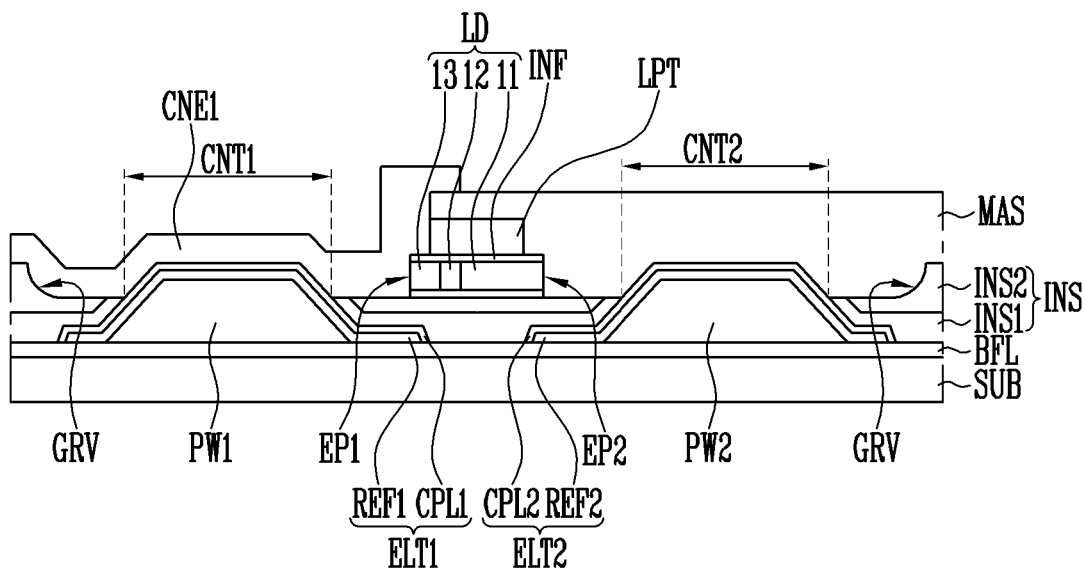

Referring to FIG. 10I, while the lower pattern layer LPT of the first insulating pattern INP1, the second ends EP2 of the light emitting elements LD, and the second electrode ELT2 including the second contact portion CNT2 may be covered with a mask MAS, a first contact electrode CNE1 may be formed on an area of the substrate SUB including the first ends EP1 of the light emitting elements LD and the first contact portion CNT1. For example, the first contact electrode CNE1 may be formed on areas of the light emitting elements LD and the first electrode ELT1 such that the first contact electrode CNE1 comes into contact with the first ends EP1 of the light emitting elements LD and an area of the first electrode ELT1.

Figure 10J:
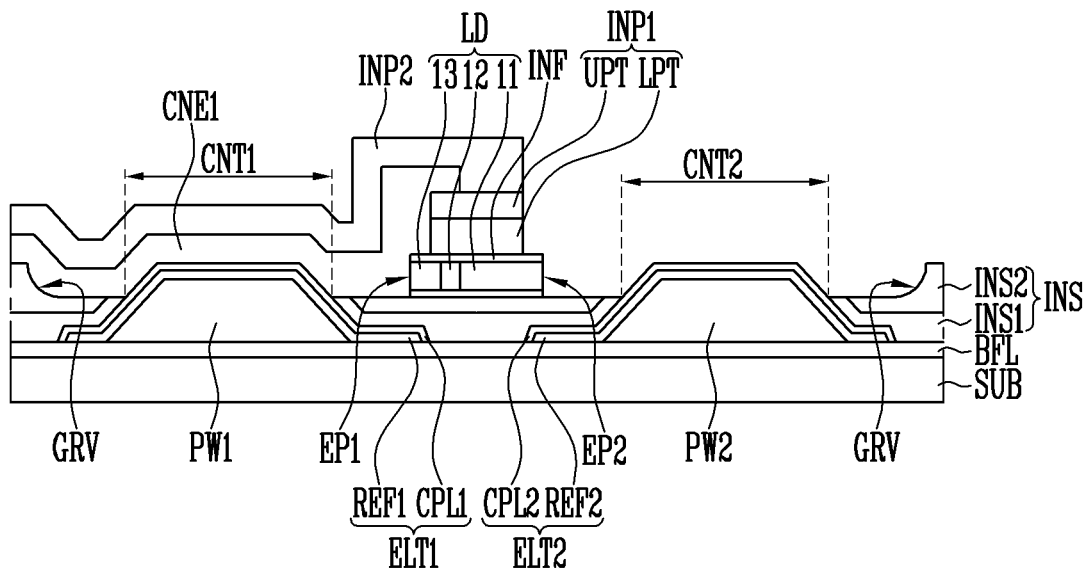

Referring to FIG. 10J, a second insulating pattern INP2 may be formed on the first contact electrode CNE1 to cover at least the first contact electrode CNE1. Furthermore, in an embodiment, at the step of forming the second insulating pattern INP2, e.g., at the step of patterning the second insulating pattern INP2, an upper pattern layer UPT of the first insulating pattern INP1 may also be formed by etching together the mask MAS shown in FIG. 10I. In an embodiment, the upper pattern layer UPT and the second insulating pattern INP2 may be successively formed. In other embodiments, a first insulating pattern INP1 which has a single-layer structure and may be formed of only the lower pattern layer LPT without having the upper pattern layer UPT may be formed by adjusting the position of the mask MAS, or a first insulating pattern INP1 having a multilayer structure may be formed before the mask MAS may be formed.

Figure 10K:
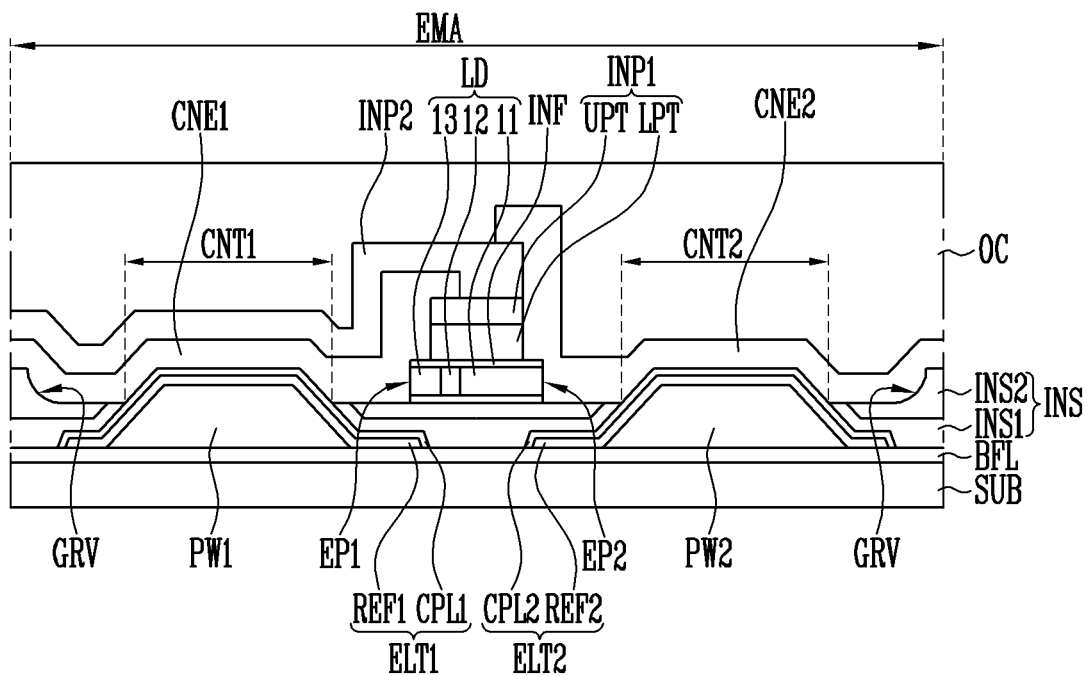

Referring to FIG. 10K, a second contact electrode CNE2 may be formed on an area of the substrate SUB that includes the second ends EP2 of the light emitting elements LD and the second contact portion CNT2. For example, the second contact electrode CNE2 may be formed on areas of the light emitting elements LD and the second electrode ELT2 such that the second contact electrode CNE2 comes into contact with the second ends EP2 of the light emitting elements LD and an area of the second electrode ELT2.

Thereafter, an overcoat layer OC may be formed on the substrate SUB on which the first and second contact electrodes CNE1 and CNE2 may be disposed. As a result, a light emitting device according to an embodiment of FIG. 7, etc. may be fabricated.

As described above, in an embodiment of the disclosure, before the light emitting elements LD may be supplied to the light emitting area EMA of the light emitting device, the second insulating layer INS2 formed of at least one organic insulating layer may be formed. Thereafter, at least one groove GRV may be formed in the second insulating layer INS2 by a rubbing scheme using the rubbing device RUD.

Particularly, in an embodiment of the disclosure, each groove GRV may be formed in the first direction DR1 in which each of the light emitting elements LD is to be aligned. In an embodiment, the first direction DR1 may be a direction perpendicular to the first and second electrodes ELT1 and ELT2, but the disclosure is not limited thereto. For example, the first direction DR1 may include not only a direction perpendicular to the first and second electrodes ELT1 and ELT2 but also a direction diagonally passing through the first and second electrodes ELT1 and ELT2. In other words, the first direction DR1 may include various directions intersecting with the first and second electrodes ELT1 and ELT2.

In an embodiment of the disclosure, after the groove GRV is formed in the second insulating layer INS2 by the rubbing scheme or the like, the light emitting elements LD may be supplied to the light emitting area EMA. Therefore, the light emitting elements LD or the insulating film INF that encloses the surfaces of the light emitting elements LD may be prevented from being damaged by the rubbing process or the like.

In an embodiment of the disclosure, a voltage may be applied between the first and second electrodes ELT1 and ELT2 simultaneously with or after the supply of the light emitting elements LD. Consequently, an electric field may be formed between the first and second electrodes ELT1 and ELT2, whereby the light emitting elements LD may be self-aligned.

In other words, according to the above-mentioned embodiments, the light emitting elements LD supplied to the light emitting area EMA may be aligned in a physical scheme and an electrical scheme by complexly using the groove GRV formed in the second insulating layer INS2 through the rubbing process or the like and the electric field formed between the first and second electrodes ELT1 and ELT2. According to the embodiments of the disclosure, the light emitting elements LD may be more uniformly aligned between the first and second electrodes ELT1 and ELT2, and the contact rate between the light emitting elements LD and the first and second electrodes ELT1 and ELT2 may be enhanced, compared to a light emitting device of a comparative example using only either a physical or an electrical alignment scheme. Consequently, emission characteristics of the light emitting device including emission luminance, emission efficiency, and/or emission uniformity can be enhanced.

Figure 11:
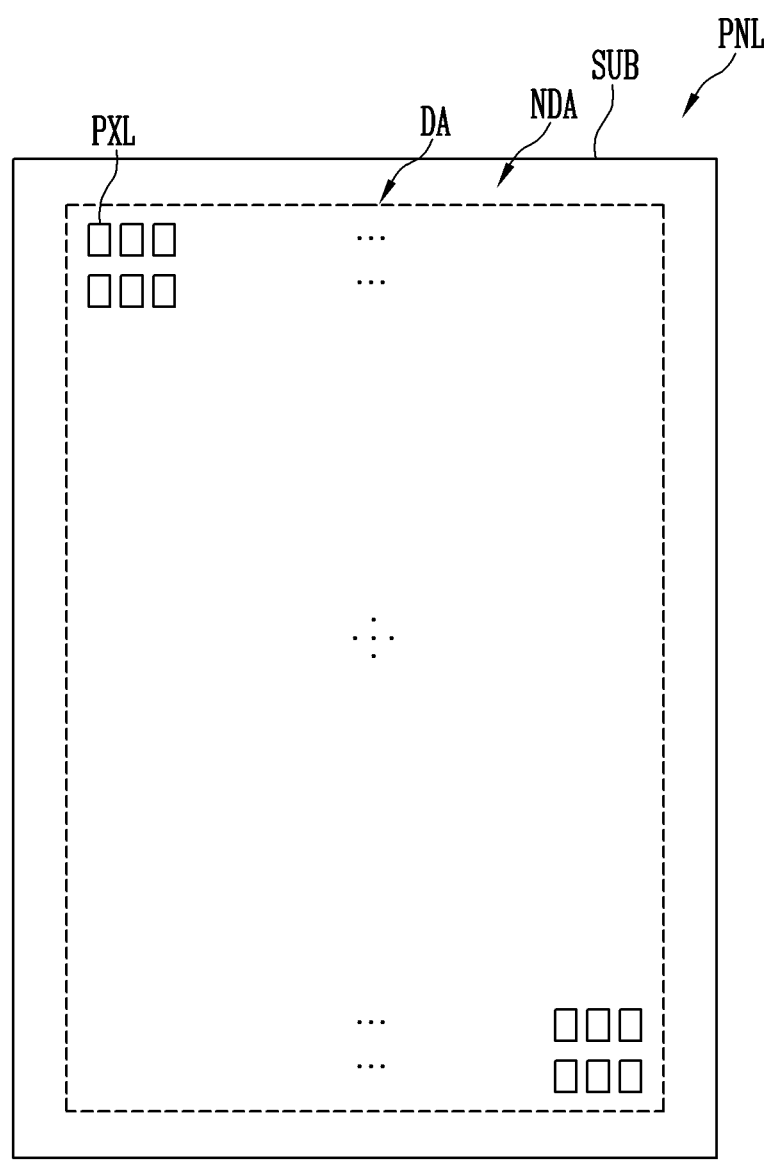
FIG. 11 is a schematic plan diagram illustrating a display device in accordance with an embodiment of the disclosure.

FIG. 11 is a schematic plan diagram illustrating a display device in accordance with an embodiment of the disclosure. FIG. 11 illustrates a display device, particularly, a display panel PNL provided in the display device, as an example of a device capable of using the light emitting device according to the above-described embodiments as a light source. In accordance with an embodiment, FIG. 11 simply illustrates the structure of the display panel PNL, focusing on a display area DA. In some embodiments, although not illustrated, at least one driving circuit (e.g., at least one of a scan driver and a data driver) and/or multiple lines may be further provided on the display panel PNL.

Referring to FIG. 11, the display panel PNL in accordance with an embodiment of the disclosure may include a substrate SUB, and pixels PXL disposed on the substrate SUB. In detail, the substrate SUB may include a display area DA that displays an image, and a non-display area NDA formed in an area other than the display area DA. The pixels PXL may be disposed in the display area DA on the substrate SUB.

In an embodiment, the display area DA may be disposed in a central portion of the display panel PNL, and the non-display area NDA may be disposed in a perimeter portion of the display panel PNL in such a way as to enclose the display area DA. The locations of the display area DA and the non-display area NDA are not limited thereto, and the locations thereof may be changed.

The substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal.

An area on the substrate SUB may be defined as the display area DA in which the pixels PXL may be disposed, and another area thereof may be defined as the non-display area NDA. For example, the substrate SUB may include the display area DA including multiple pixel regions on which the respective pixels PXL may be formed, and the non-display area NDA that encloses the display area DA. Different kinds of lines and/or internal circuits which may be connected to the pixels PXL may be disposed in the non-display area NDA.

Each of the pixels PXL may include at least one light source that is to be driven by a corresponding scan signal and a corresponding data signal, e.g., the light emitting device described in the foregoing embodiments as a light source. For example, each of the pixels PXL may include at least a pair of first and second electrodes (e.g., ELT1 and ELT2 of FIGS. 4 to 9) disposed at positions spaced apart from each other in each pixel region on the substrate SUB, and multiple light emitting elements (e.g., LD of FIGS. 4 to 9) connected in parallel to each other between the first and second electrodes ELT1 and ELT2. Furthermore, each of the light emitting elements LD may be a subminiature rod-type light emitting diode having a small size ranging from the nanoscale to the microscale.

In an embodiment, each pixel PXL may be an active pixel, but the disclosure is not limited thereto. For example, the types, the structures, and/or the driving schemes of the pixels PXL in the display device according to the disclosure are not particularly limited. In other words, each pixel PXL may form a pixel of various well-known passive or active light emitting display devices.

Figure 12A:
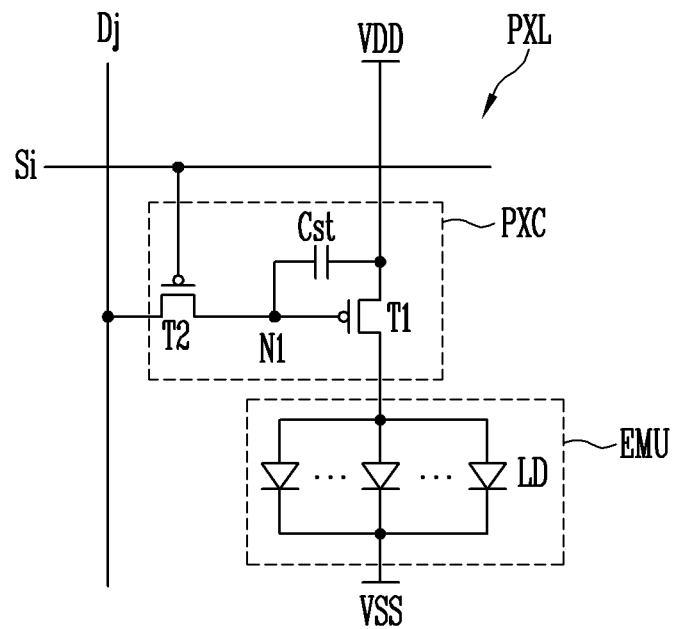
FIGS. 12A to 12C are schematic circuit diagrams illustrating different embodiments of a pixel of FIG. 11.
Figure 12B:
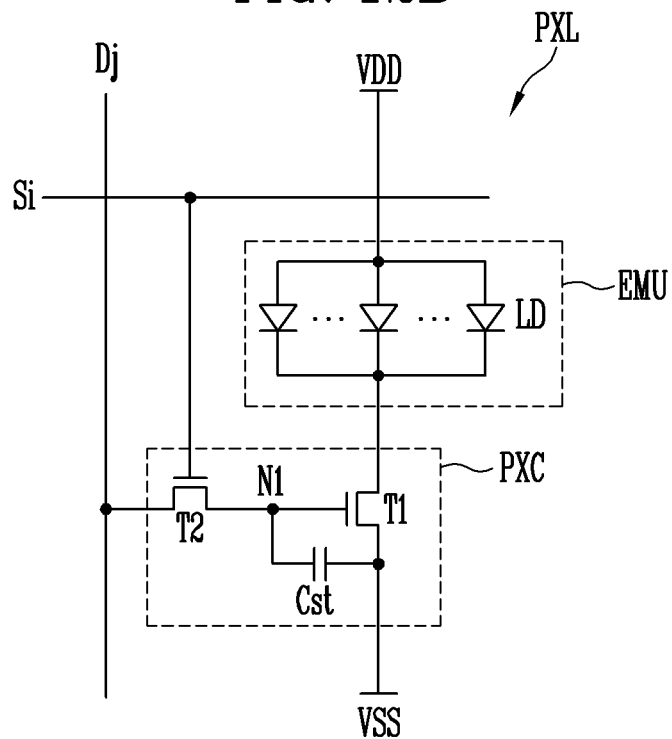
Figure 12C:
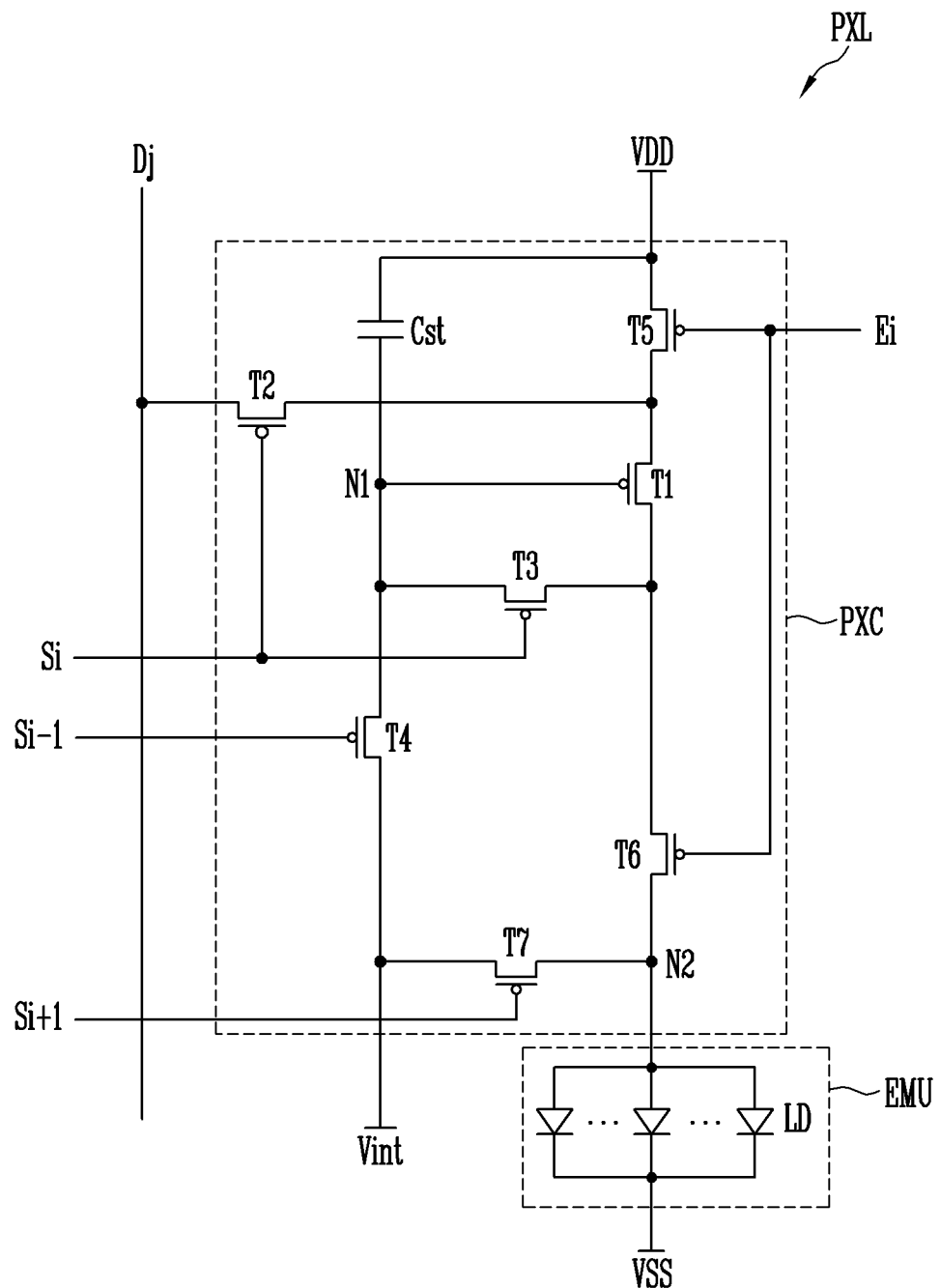

FIGS. 12A to 12C are schematic circuit diagrams illustrating different embodiments of a pixel PXL of FIG. 11. In detail, FIGS. 12A to 12C illustrate different embodiments of a pixel PXL capable of being provided in an active light emitting display device. For example, each of the pixels PXL illustrated in FIGS. 12A to 12C may be any one of the pixels PXL provided on the display panel PNL of FIG. 11. The pixels PXL may have substantially the same or similar structure.

Referring to FIG. 12A, the pixel PXL in accordance with an embodiment of the disclosure may include a light emitting part EMU that generates light having a luminance corresponding to a data signal, and a pixel circuit PXC that drives the light emitting part EMU.

In an embodiment, the light emitting part EMU may include multiple light emitting elements LD connected in parallel to each other between first and second power supplies VDD and VSS. Here, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

Although FIG. 12A illustrates an embodiment in which the light emitting elements LD forming the light emitting part EMU of each pixel PXL may be connected in parallel to each other in the same direction (e.g., in a forward direction) between the first power supply VDD and the second power supply VSS, the disclosure is not limited thereto. For example, in an embodiment, some of the light emitting elements LD may be connected to each other in the forward direction between the first and second power supplies VDD and VSS, and other light emitting elements LD may be connected to each other in the reverse direction. In other embodiments, at least one pixel PXL may include only a single light emitting element LD.

In an embodiment, first ends (e.g., EP1 of FIGS. 4 to 9) of the light emitting elements LD constituting each light emitting part EMU may be connected in common to a corresponding pixel circuit PXC through a first electrode (e.g., ELT1 of FIGS. 4 to 9), and be connected to the first power supply VDD through the pixel circuit PXC. Furthermore, second ends (e.g., EP2 of FIGS. 4 to 9) of the light emitting elements LD may be connected in common to the second power supply VSS through a second electrode (e.g., ELT2 of FIGS. 4 to 9). For the sake of convenience, hereinafter, the first and second electrodes ELT1 and ELT2 included in each light emitting part EMU will be respectively referred to first and second pixel electrodes.

Each light emitting part EMU may emit light having luminance corresponding to driving current supplied thereto through the corresponding pixel circuit PXC. Thereby, an image may be displayed on the display area DA.

The pixel circuit PXC may be connected to a scan line Si and a data line Dj of the corresponding pixel PXL. For example, if the pixel PXL is disposed on an i-th row and a j-th column of the display area DA, the pixel circuit PXC of the pixel PXL may be connected to an i-th scan line Si and a j-th data line Dj of the display area DA. The pixel circuit PXC may include first and second transistors T1 and T2, and a storage capacitor Cst.

A first electrode of the first transistor (e.g., driving transistor; T1) may be connected to the first power supply VDD, and a second electrode thereof may be connected to the light emitting elements LD through the first pixel electrode (e.g., the first electrode ELT1 of the corresponding light emitting part EMU). Here, the first and second electrodes of the first transistor T1 may be different electrodes. For example, if the first electrode is a source electrode, the second electrode may be a drain electrode. A gate electrode of the first transistor T1 may be connected to a first node N1. The first transistor T1 may control driving current to be supplied to the light emitting part EMU in response to a voltage of the first node N1.

A first electrode of the second transistor (e.g., switching transistor; T2) may be connected to the data line Dj, and a second electrode thereof may be connected to the first node N1. A gate electrode of the second transistor T2 may be connected to the scan line Si.

In case that a scan signal of a gate-on voltage (e.g., a low voltage) is supplied from the scan line Si, the second transistor T2 may be turned on to electrically connect the first node N1 to the data line Dj. During each frame period, a data signal of a corresponding frame may be supplied to the data line Dj. The data signal may be transmitted to the first node N1 via the second transistor T2. Thereby, a voltage corresponding to the data signal may be charged to the storage capacitor Cst.

An electrode of the storage capacitor Cst may be connected to the first power supply VDD, and another electrode thereof may be connected to the first node N1. The storage capacitor Cst may charge voltage corresponding to a data signal supplied to the first node N1 during each frame period, and maintain the charged voltage until a data signal of a subsequent frame may be supplied.

Although in FIG. 12 the transistors, e.g., the first and second transistors T1 and T2, included in the pixel circuit PXC have been illustrated as being formed of P-type transistors, the disclosure is not limited thereto. In other words, at least one of the first and second transistors T1 and T2 may be changed to an N-type transistor.

For example, as shown in FIG. 12B, both the first and second transistors T1 and T2 may be N-type transistors. The configuration and operation of the pixel PXL illustrated in FIG. 12B, other than the fact that connection positions of some circuit elements have been changed depending on a change in type of the first and second transistors T1 and T2, may be substantially similar to those of the pixel PXL of FIG. 12A. Therefore, detailed description of the pixel PXL of FIG. 12B will be omitted.

The structure of the pixel circuit PXC is not limited to the embodiments shown in FIGS. 12A and 12B. In other words, the pixel circuit PXC may be formed of a well-known pixel circuit which may have various structures and/or be operated by various driving schemes. For example, the pixel circuit PXC may be configured in the same manner as that of an embodiment illustrated in FIG. 12C.

Referring to FIG. 12C, the pixel circuit PXC may be connected not only to a scan line Si of a corresponding horizontal line but also to at least one another scan line (or a control line). For example, the pixel circuit PXC of the pixel PXL disposed on the i-th row of the display area DA may be further connected to an i−1-th scan line Si−1 and/or an i+1-th scan line Si+1. In an embodiment, the pixel circuit PXC may be connected not only to the first and second power supplies VDD and VSS but also to a third power supply. For instance, the pixel circuit PXC may also be connected to an initialization power supply Vint. In an embodiment, the pixel circuit PXC may include first to seventh transistors T1 to T7 and a storage capacitor Cst.

A first electrode of the first transistor T1 may be connected to the first power supply VDD via the fifth transistor T5, and a second electrode thereof may be connected to the light emitting part EMU via the sixth transistor T6. A gate electrode of the first transistor T1 may be connected to a first node N1. The first transistor T1 may control driving current to be supplied to the light emitting part EMU in response to a voltage of the first node N1.

The second transistor T2 may be connected between the data line Dj and the first electrode of the first transistor T1. A gate electrode of the second transistor T2 may be connected to the corresponding scan line Si. In case that a scan signal of a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first electrode of the first transistor T1.

The third transistor T3 may be connected between the second electrode of the first transistor T1 and the first node N1. A gate electrode of the third transistor T3 may be connected to the corresponding scan line Si. In case that a scan signal of a gate-on voltage is supplied from the scan line Si, the third transistor T3 may be turned on to electrically connect the second electrode of the first transistor T1 to the first node N1. Therefore, if the third transistor T3 is turned on, the first transistor T1 may be connected in the form of a diode.

The fourth transistor T4 may be connected between the first node N1 and an initialization power supply Vint. A gate electrode of the fourth transistor T4 may be connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be connected between the first power supply VDD and the first transistor T1. A gate electrode of the fifth transistor T5 may be connected to a corresponding emission control line, e.g., an i-th emission control line Ei. The fifth transistor T5 may be turned off in case that an emission control signal of a gate-off voltage (e.g., a high voltage) is supplied to the emission control line Ei, and may be turned on in other cases.

The sixth transistor T6 may be connected between the first transistor T1 and the light emitting part EMU (e.g., the first pixel electrode connected to one end of each of the light emitting elements LD). A second node N2 may be disposed between the sixth transistor T6 and the light emitting part EMU. A gate electrode of the sixth transistor T6 may be connected to a corresponding emission control line, e.g., the i-th emission control line Ei. The sixth transistor T6 may be turned off in case that an emission control signal of a gate-off voltage is supplied to the emission control line Ei, and may be turned on in other cases.

The seventh transistor T7 may be connected between the light emitting part EMU (e.g., the first pixel electrode connected to one end of each of the light emitting elements LD) and the initialization power supply Vint. A gate electrode of the seventh transistor T7 may be connected to any one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first pixel electrode.

The storage capacitor Cst may be connected between the first power supply VDD and the first node N1. The storage capacitor Cst may store a voltage corresponding both to the data signal applied to the first node N1 during each frame period and to the threshold voltage of the first transistor T1.

Although in FIG. 12C the transistors, e.g., the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

The structure of the pixel PXL which may be applied to the disclosure is not limited to the embodiments illustrated in FIGS. 12A to 12C, and each pixel PXL may have various well-known structures. For example, the pixel circuit PXC included in each pixel PXL may be formed of a well-known pixel circuit which may have various structures and/or be operated by various driving schemes. In an embodiment of the disclosure, each pixel PXL may be configured in a passive light emitting display device, or the like. The pixel circuit PXC may be omitted, and each of the first and second pixel electrodes of the light emitting part EMU may be electrically connected (e.g., directly connected) to the scan line Si, the data line Dj, a power line, and/or the control line.

Figure 13:
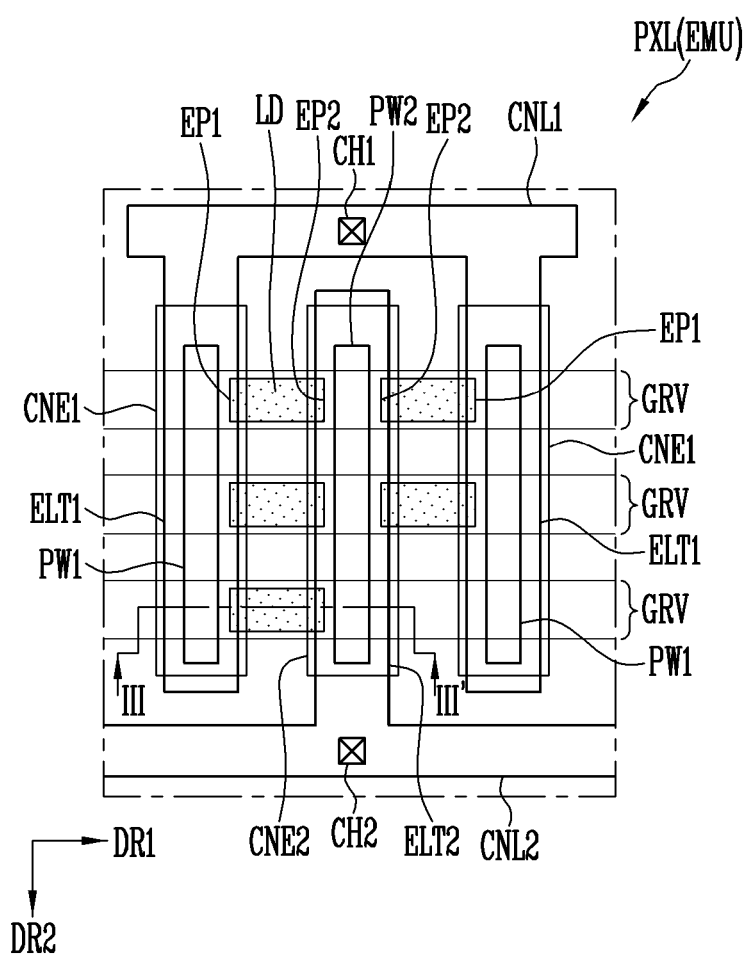
FIG. 13 is a schematic plan diagram illustrating a pixel of FIG. 11 and, particularly, a plan diagram illustrating a light emitting part of each pixel.
Figure 14:
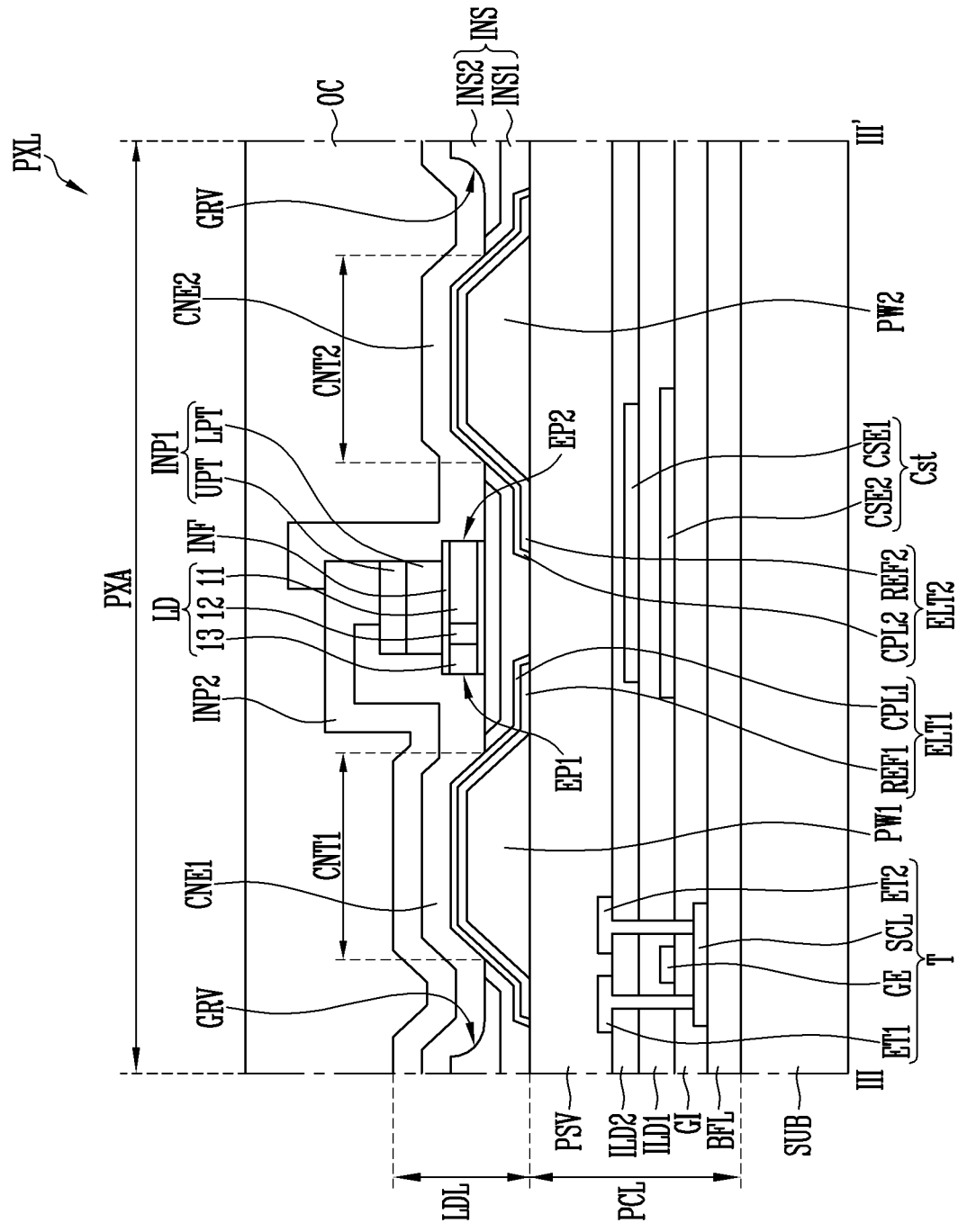
FIG. 14 is a schematic sectional diagram taken along line III-III' of FIG. 13.

FIG. 13 is a schematic plan diagram illustrating the pixel PXL of FIG. 11 and, particularly, a plan diagram illustrating a light emitting part EMU of each pixel PXL. FIG. 14 is a schematic sectional diagram taken along line III-III' of FIG. 13.

In an embodiment, the light emitting part EMU illustrated in FIG. 13 may be a configuration substantially similar or equal to that of the light emitting device according to the above-described embodiments, e.g., an embodiment illustrated in FIG. 4 or the like. A display element layer LDL shown in FIG. 14 illustrates a cross-section corresponding to the light emitting part EMU of FIG. 13 and, e.g., may be configured in a manner substantially similar or equal to that of the cross-section of the light emitting device according to an embodiment illustrated in FIG. 7, etc. Therefore, in FIGS. 13 and 14, like reference numerals are used to designate the same or similar components as those of the embodiments of FIGS. 4 and 7, and detailed descriptions thereof will be omitted.

Referring to FIGS. 13 to 14, each pixel PXL may include a pixel circuit layer PCL and a display element layer LDL that may be stacked on each other on the substrate SUB.

In an embodiment, the pixel circuit layer PCL may include multiple circuit elements disposed in the display area DA. For example, the pixel circuit layer PCL may include circuit elements which may be formed in respective pixel regions PXA to form the respective pixel circuits (e.g., PXC of FIGS. 12A to 12C).

For instance, the pixel circuit layer PCL may include at least one transistor T and a storage capacitor Cst which may be disposed in each pixel region PXA. For the convenience sake, FIG. 14 illustrates only any one transistor T among transistors provided in the pixel circuit PXC as a representative example, and the transistors for forming each pixel circuit PXC may have a substantially identical or similar cross-sectional structure. Furthermore, in the disclosure, the structure of each transistor T is not limited to that of an embodiment shown in FIG. 14. For example, each transistor T may have various well-known cross-sectional structures. Furthermore, in an embodiment of the disclosure, multiple transistors provided to configure the respective pixel circuits PXC may have different types and/or structures.

The pixel circuit layer PCL may include multiple insulating layers. For example, the pixel circuit layer PCL may include a gate insulating layer GI, first and second interlayer insulating layers ILD1 and ILD2, and a passivation layer PSV which may be successively stacked on each other on one surface of the substrate SUB. In an embodiment, the gate insulating layer GI, the first and second interlayer insulating layers ILD1 and ILD2, and the passivation layer PSV may be successively stacked between the substrate SUB and the display element layer LDL. The pixel circuit layer PCL may further include at least one buffer layer BFL disposed between the substrate SUB and the circuit elements. In an embodiment, at least one of the buffer layer BFL, the gate insulating layer GI, the first and second interlayer insulating layers ILD1 and ILD2, and the passivation layer PSV may be formed on an overall area of one surface of the substrate SUB including the display area DA and the non-display area NDA.

In an embodiment, the buffer layer BFL may prevent impurities from diffusing into each transistor T. The buffer layer BFL may be formed of a single layer, or may be formed of multiple layers having at least two layers. In the case where the buffer layer BFL has a multilayer structure, the respective layers may be formed of the same material or different materials. In an embodiment, the buffer layer BFL may be omitted.

In an embodiment, each transistor T may include a semiconductor layer SCL, a gate electrode GE, a first transistor electrode ET1, and a second transistor electrode ET2. FIG. 14 illustrates an embodiment where the first and second transistor electrodes ET1 and ET2 may be formed separately from the semiconductor layer SCL, but the disclosure is not limited thereto. For example, in an embodiment of the disclosure, the first and/or second transistor electrode ET1 and/or ET2 that forms at least one transistor T disposed in each pixel region PXA may be integrally connected with the semiconductor layer SCL of the corresponding transistor T.

The semiconductor layer SCL may be disposed on the buffer layer BFL. For example, the semiconductor layer SCL may be disposed between the gate insulating layer GI and the substrate SUB on which the buffer layer BFL may be formed. The semiconductor layer SCL may include a first area which comes into contact with the first transistor electrode ET1, a second area which comes into contact with the second transistor electrode ET2, and a channel area disposed between the first and second areas. In an embodiment, any one of the first and second areas may be a source area, and another may be a drain area.

In an embodiment, the semiconductor layer SCL may be a semiconductor pattern formed of polysilicon, amorphous silicon, an oxide semiconductor, etc., or a combination thereof. The channel region of the semiconductor layer SCL may be an intrinsic semiconductor, which may be an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the first interlayer insulating layer ILD1 and overlap at least an area of the semiconductor layer SCL.

The first and second transistor electrodes ET1 and ET2 may be disposed on the semiconductor layer SCL with at least one insulating layer, e.g., multiple insulating layers, interposed therebetween. For example, the first and second transistor electrodes ET1 and ET2 may be disposed on the semiconductor layer SCL with the first and second interlayer insulating layers ILD1 and ILD2 interposed therebetween. The first and second transistor electrodes ET1 and ET2 may be electrically connected to the semiconductor layer SCL. For example, the first and second transistor electrodes ET1 and ET2 may respectively come into contact with the first and second areas of the semiconductor layer SCL through respective contact holes which pass through the gate insulating layer GI and the first and second interlayer insulating layers ILD1 and ILD2.

In an embodiment, the storage capacitor Cst may include first and second capacitor electrodes CSE1 and CSE2 disposed on different layers at positions spaced apart from each other. For example, the first capacitor electrode CSE1 may be disposed between the first and second interlayer insulating layers ILD1 and ILD2. The second capacitor electrode CSE2 may be disposed on at least one conductive layer that forms the transistor T, e.g., on the same layer as that of at least one of the semiconductor layer SCL, the gate electrode GE, and the first and second transistor electrodes ET1 and ET2. For example, the second capacitor electrode CSE2 along with the gate electrode GE of the transistor T may be disposed between the gate insulating layer GI and the first interlayer insulating layer ILD1.

Although for the sake of description FIG. 14 illustrates that each of the first and second capacitor electrodes CSE1 and CSE2 may be formed of a single layer, the disclosure is not limited thereto. For example, at least one of the first and second capacitor electrodes CSE1 and CSE2 may be formed of multiple layers, and the stacked structures and/or positions of the first and second capacitor electrodes CSE1 and CSE2 may be changed in various ways.

The display element layer LDL may be a layer on which the light emitting part EMU of each pixel PXL may be disposed and, for example, may be configured in the same manner as that of the light emitting device according to the embodiments described with reference to FIGS. 4 and 7. For example, the display element layer LDL may include first and second electrodes ELT1 and ELT2 disposed in each pixel region PXA over the pixel circuit layer PCL, and multiple light emitting elements LD disposed in parallel to each other between the first and second electrodes ELT1 and ELT2. For example, the display element layer LDL may include multiple light emitting elements LD which may be disposed over the pixel circuit layer PCL in each pixel region PXA and configure each light emitting part EMU.

In an embodiment, the first electrode ELT1 of the display element layer LDL, e.g., the first pixel electrode, may be electrically connected to at least one circuit element disposed in the corresponding pixel region PXA. For example, the first pixel electrode may be electrically connected to the first transistor T1 shown in FIGS. 12A and 12B or the sixth and seventh transistors T6 and T7 shown in FIG. 12C through at least one contact hole passing through the passivation layer PSV, e.g., through the first contact hole CH1 of FIG. 13.

The second electrode ELT2 of the display element layer LDL, e.g., the second pixel electrode, may be electrically connected with a power line (or a control line), which is not illustrated, through the second contact hole CH2, etc. In an embodiment, the power line may be disposed on the same layer as that of at least one conductive layer formed on the pixel circuit layer PCL and may be electrically connected with the second electrode ELT2 of the display element layer LDL through the second contact hole CH2, but the disclosure is not limited thereto.

As described in the foregoing embodiment, the light emitting part EMU of each pixel PXL may be configured of a light emitting device using at least one light emitting element LD. Furthermore, in an embodiment of the disclosure, each pixel region PXA of the display element layer LDL may include at least one groove GRV formed in the insulating layer INS (e.g., particularly, the second insulating layer INS2 formed of an organic insulating layer) in the first direction DR1 intersecting with the first and second electrodes ELT1 and ELT2. Consequently, emission characteristics of the display device may be enhanced.

Since the light emitting device according to an embodiment of the disclosure has been described above, detailed explanation of each light emitting part EMU corresponding to the light emitting device and the display element layer LDL for configuring the light emitting part EMU will be omitted.

In a light emitting device, a method of fabricating the light emitting device, and a display device including the light emitting device in accordance with various embodiments of the disclosure, multiple light emitting elements LD can be uniformly aligned at high efficiency between first and second electrodes ELT1 and ELT2 disposed in each light emitting area EMA or pixel region PXA. Consequently, emission characteristics of the light emitting device and the display device including the same, e.g., emission luminance, emission efficiency and/or emission uniformity, can be enhanced.

While the scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims, including equivalents thereof.

The scope of the disclosure is not limited by detailed descriptions of the specification, and should be defined by the accompanying claims, and equivalents thereof. Furthermore, all changes or modifications of the disclosure derived from the meanings and scope of the claims, and equivalents thereof should be construed as being included in the scope of the disclosure.

The invention claimed is:

1. A light emitting device comprising:
   a first electrode and a second electrode disposed on a substrate and spaced apart from each other;
   an insulating layer disposed on the substrate on which the first electrode and the second electrode are formed, the insulating layer including:
      a groove extending in a first direction intersecting with the first electrode and the second electrode; and
      a first contact portion and a second contact portion that respectively expose areas of the first electrode and the second electrode;
   light emitting elements disposed in the groove and located between the first and the second electrodes, each of the light emitting elements comprising a first end and a second end electrically connected to the first electrode and the second electrode, respectively;
   a first contact electrode electrically connected to the light emitting elements on the first ends, and electrically connected to the first electrode on the first contact portion; and
   a second contact electrode electrically connected to the light emitting elements on the second ends, and electrically connected to the second electrode on the second contact portion.

2. The light emitting device according to claim 1, wherein each of the light emitting elements comprises a rod-type light emitting diode having a length extending in the first direction.

3. The light emitting device according to claim 2, wherein the groove has a width greater than a diameter or width of each of the light emitting elements.

4. The light emitting device according to claim 1, wherein
   the first electrode and the second electrode are disposed parallel to each other in at least an area on the substrate, and
   each of the first electrode and the second electrode extends in a second direction intersecting with the first direction.

5. The light emitting device according to claim 1, wherein the insulating layer comprises at least one organic insulating layer including a polymer.

6. The light emitting device according to claim 5, wherein the insulating layer further comprises at least one inorganic insulating layer disposed between the substrate and the organic insulating layer.

7. The light emitting device according to claim 1, comprising a plurality of grooves disposed in a second direction intersecting with the first direction.

8. The light emitting device according to claim 1, further comprising:
a first partition wall disposed between the substrate and the first electrode; and
a second partition wall disposed between the substrate and the second electrode.

9. The light emitting device according to claim 1, further comprising a first insulating pattern disposed on areas of the light emitting elements and located between the first contact electrode and the second contact electrode.

10. The light emitting device according to claim 9, further comprising a second insulating pattern that covers an upper portion of the first insulating pattern and the first contact electrode.

11. The light emitting device according to claim 10, wherein an end of the second contact electrode is disposed on an end of the second insulating pattern that is adjacent to the second ends of the light emitting elements.

12. A method of fabricating a light emitting device, comprising:
forming, on a substrate, a first partition wall and a second partition wall spaced apart from each other;
forming a first electrode and a second electrode on the first partition wall and the second partition wall, respectively;
forming at least one insulating layer on the substrate on which the first electrode and the second electrode are formed;
forming, in a surface of the insulating layer, at least one groove intersecting with the first electrode and the second electrode;
supplying light emitting elements onto the at least one insulating layer including in the at least one groove;
aligning the light emitting elements by forming an electric field between the first electrode and the second electrode;
forming a first contact portion and a second contact portion by etching the at least one insulating layer so that areas of the first electrode and the second electrode are exposed;
forming a first contact electrode on an area of the substrate including first ends of the light emitting elements and the first contact portion; and
forming a second contact electrode on an area of the substrate including second ends of the light emitting elements and the second contact portion.

13. The method according to claim 12, wherein the forming of the at least one insulating layer comprises:
forming an inorganic insulating layer on the substrate on which the first electrode and the second electrode are formed; and
forming an organic insulating layer on the inorganic insulating layer.

14. The method according to claim 13, wherein the forming of the at least one groove comprises:
disposing a rubbing device on the organic insulating layer to contact the organic insulating layer; and
moving at least one of the substrate and the rubbing device in a direction intersecting the first electrode and the second electrode, and pressing the organic insulating layer.

15. The method according to claim 13, wherein the forming of the at least one groove comprises:
disposing a rubbing device on the organic insulating layer; and
forming a plurality of grooves in a surface of the organic insulating layer by pressing the organic insulating layer at intervals of a distance.

16. The method according to claim 13, wherein the forming of the first contact portion and the second contact portion comprises:
forming a first insulating pattern on areas of the light emitting elements such that the first ends and the second ends of the light emitting elements are exposed,
etching the organic insulating layer over the areas of the first electrode and the second electrode; and
etching the inorganic insulating layer such that the areas of the first electrode and the second electrode are exposed.

17. The method according to claim 16, wherein the forming of the first contact electrode and the second contact electrode comprises:
forming the first contact electrode on the areas of the light emitting elements and the first contact portion such that the first contact electrode is in contact with the first ends of the light emitting elements and the area of the first electrode;
forming a second insulating pattern on the first contact electrode; and
forming the second contact electrode on the areas of the light emitting elements and the second contact portion such that the second contact electrode is in contact with the second ends of the light emitting elements and the area of the second electrode.

18. The method according to claim 12, wherein the aligning of the light emitting elements comprises applying, onto the substrate by an inkjet printing scheme or a slit coating scheme, a solution in which the plurality of light emitting elements are dispersed.

19. A display device comprising:
a substrate including a display area; and
a pixel disposed in the display area, the pixel comprising:
a first electrode and a second electrode disposed on the substrate and spaced apart from each other;
an insulating layer disposed on the substrate on which the first electrode and the second electrode are formed, the insulating layer including:
a groove extending in a first direction intersecting with the first electrode and the second electrode; and
a first contact portion and a second contact portion that respectively expose areas of the first electrode and the second electrode;
light emitting elements disposed in the groove between the first electrode and the second electrode, each of the light emitting elements comprising a first end and a second end electrically connected to the first electrode and the second electrode, respectively;
a first contact electrode electrically connected to the light emitting elements on the first ends, and electrically connected to the first electrode on the first contact portion; and a second contact electrode electrically connected to the light emitting elements on the second ends, and electrically connected to the second electrode on the second contact portion.

* * * * *